(12) United States Patent
Sato

(10) Patent No.: US 8,681,525 B2
(45) Date of Patent: Mar. 25, 2014

(54) SEMICONDUCTOR DEVICE INCLUDING PLURAL CHIPS STACKED TO EACH OTHER

(75) Inventor: Homare Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 51 days.

(21) Appl. No.: 13/347,521

(22) Filed: Jan. 10, 2012

(65) Prior Publication Data

US 2012/0182778 A1 Jul. 19, 2012

(30) Foreign Application Priority Data

Jan. 17, 2011 (JP) .................................. 2011-007204

(51) Int. Cl.
*G11C 5/06* (2006.01)
(52) U.S. Cl.
USPC .......... 365/63; 365/51; 365/191; 365/230.06; 365/189.05; 365/189.03
(58) Field of Classification Search
USPC .................... 365/63, 51, 191, 230.06, 189.05, 365/189.03
See application file for complete search history.

(56) References Cited

U.S. PATENT DOCUMENTS

| | | | | |
|---|---|---|---|---|
| 4,982,265 A * | 1/1991 | Watanabe et al. | ............. | 257/737 |
| 5,463,253 A * | 10/1995 | Waki et al. | ..................... | 257/724 |
| 7,123,497 B2 * | 10/2006 | Matsui et al. | ................... | 365/51 |
| 7,148,563 B2 * | 12/2006 | So et al. | ......................... | 257/685 |
| 7,221,057 B2 * | 5/2007 | Goto | ............................. | 257/777 |
| 7,253,517 B2 * | 8/2007 | Heston | .......................... | 257/728 |
| 7,266,038 B2 * | 9/2007 | Boldt | ....................... | 365/230.06 |
| 7,286,384 B2 * | 10/2007 | Wendt et al. | .................... | 365/63 |
| 7,385,281 B2 * | 6/2008 | Nishio et al. | ................... | 257/686 |
| 7,466,577 B2 * | 12/2008 | Sekiguchi et al. | ............. | 365/51 |
| 7,545,663 B2 * | 6/2009 | Ikeda et al. | ..................... | 365/63 |
| 7,558,096 B2 * | 7/2009 | Ikeda | .............................. | 365/51 |
| 7,566,958 B2 * | 7/2009 | So et al. | ......................... | 257/685 |
| 7,745,919 B2 * | 6/2010 | Shibata et al. | ................ | 257/686 |
| 7,795,706 B2 * | 9/2010 | Ikeda | ............................ | 257/621 |
| 7,894,293 B2 * | 2/2011 | Ikeda et al. | ............. | 365/230.03 |
| 7,957,209 B2 * | 6/2011 | Ruckerbauer | ................ | 365/191 |
| 8,031,505 B2 * | 10/2011 | Kang et al. | ...................... | 365/51 |
| 8,059,443 B2 * | 11/2011 | McLaren et al. | ................ | 365/64 |
| 8,076,764 B2 * | 12/2011 | Yamada et al. | ............... | 257/686 |
| 8,159,057 B2 * | 4/2012 | Okada et al. | .................. | 257/684 |
| 8,243,486 B2 * | 8/2012 | Riho | ............................. | 365/51 |
| 8,274,844 B2 * | 9/2012 | Takahashi et al. | ........ | 365/189.05 |
| 8,473,653 B2 * | 6/2013 | Kondo et al. | ................... | 710/71 |
| 2007/0126105 A1 | 6/2007 | Yamada et al. | | |

FOREIGN PATENT DOCUMENTS

JP 2007-157266 A 6/2007

* cited by examiner

*Primary Examiner* — Viet Q Nguyen
(74) *Attorney, Agent, or Firm* — McGinn IP Law Group, PLLC

(57) ABSTRACT

Such a device is disclosed that includes a first semiconductor chip including a plurality of first terminals, a plurality of second terminals, and a first circuit coupled between the first and second terminals and configured to control combinations of the first terminals to be electrically connected to the second terminals, and a second semiconductor chip including a plurality of third terminals coupled respectively to the second terminals, an internal circuit, and a second circuit coupled between the third terminals and the internal circuit and configured to activate the internal circuit when a combination of signals appearing at the third terminals indicates a chip selection.

14 Claims, 17 Drawing Sheets

FIG. 7

|  | Logical | | | | | | | | Physical | | | | | | | |
|---|---|---|---|---|---|---|---|---|---|---|---|---|---|---|---|---|
|  | LRA-1 | LRA-3 | | | LRA-2 | | | | PRA-1 | | | | PRA-2 | | | |
|  | 1RANK | | | | 2RANK | | | | 1RANK | | | | 2RANK | | | |
|  | 1KB | | 2KB | | 1KB | | 2KB | | 1KB | | 2KB | | 1KB | | 2KB | |
|  | X8 | X4 | X8 | X4 | X8 | X4 | X8 | X4 | X8 | X4 | X8 | X4 | X8 | X4 | X8 | X4 |
| SID0 | | | X15 | | | | | | | | | | | | | |
| SID1 | X16 | | Y11 | Y13 | X16 | | Y11 | Y13 | | | | | | | | |
| SID2 | X17 | | | | CS1 | | | | C2 | | C0 | | C1 | | CS1 | |

2

SEMICONDUCTOR DEVICE INCLUDING PLURAL CHIPS STACKED TO EACH OTHER

BACKGROUND OF THE INVENTION

1. Field of the Invention

The present invention relates to a semiconductor device, and more particularly to a semiconductor device in which a front-end unit having an interface function and a back-end unit including a memory core are integrated on separate semiconductor chips.

2. Description of Related Art

Memory capacities required for semiconductor memory devices such as a DRAM (Dynamic Random Access Memory) are increasing year by year. To satisfy this requirement, a memory device called "multi chip package" having a plurality of memory chips stacked has been proposed in recent years. However, ordinary memory chips that can operate independently by themselves are used in the multi chip package. The ordinary memory chip includes a so-called front end unit that establishes interface to outside (a memory controller, for example). Accordingly, a chip area that a memory core can be formed in each memory chip is limited by existence of the front end unit. It is therefore difficult to greatly increase a memory capacity of one memory chip.

Additionally, although the front end unit is a logic circuit, transistors including the front end unit are fabricated at the same time as transistors including a back end unit constituting a memory core. Therefore, it is difficult to speed-up the transistors of the front end unit.

To solve these problems, a method that enables to constitute one semiconductor memory device by integrating a front end unit and a back end unit on separate chips, respectively, and stacking these chips has been proposed (see Japanese Patent Application Laid-open No. 2007-157266). According to this method, the chip areas that the memory core can be formed become larger in the plural core chips, and therefore the memory capacity of one core chip can be increased. On the other hand, an interface chip that has the front end unit can be fabricated by a process different from the memory core, which allows the logic circuits to be formed by a high-speed transistor. Furthermore, because the plural core chips can be allocated to one interface chip, a semiconductor memory device with a quite large capacity and a high speed operation can be provided.

However, this type of semiconductor memory may be recognized as one memory chip by an external controller. Accordingly, when plural core chips are allocated to one interface chip, how to perform an individual access to each core chip becomes an issue. That is, in the ordinary multi chip package, each memory chip can be individually selected by using a chip select terminal (/CS) provided on each memory chip. In contrast, in the semiconductor memory device described above, a chip select terminal is provided on the interface chip. Therefore, each core chip cannot be individually selected by using a chip selection signal.

As a method for solving this problem, Japanese Patent Application Laid-open No. 2007-157266 realizes individual selection of each core chip by allocating chip addresses to the respective core chips and commonly supplying a chip selection address to the respective core chips from an interface chip.

Meanwhile, a plurality of operation modes may be prepared for semiconductor devices such as the DRAM. One of the operation modes is selected at the manufacturing stages. This is because it is not efficient to separately design and manufacture semiconductor devices with respect to each operation mode. The same holds true for stacked semiconductor devices. It is considered desirable that plural operation modes are prepared and one of the operation modes is selected at the manufacturing stages.

However, because selection of each core chip in the stacked semiconductor device is performed based on a chip selection address, bits of an address and the like to be used as the chip selection address vary according to the operation modes. Therefore, a circuit that changes the bits of an address and the like to be used as the chip selection address according to the operation modes is required. When such a circuit is provided in each core chip, the circuit scale is increased.

SUMMARY

In one embodiment, there is provided a semiconductor device that includes: a plurality of first chips stacked to each other and having first chip addresses different from each other; and a second chip having a plurality of address terminals and a chip select terminal, wherein the second chip generates a second chip address by selecting information supplied to the address terminals and the chip select terminal based on a mode signal, and each of the first chips is selected when the second chip address is coincident with the first chip address assigned thereto.

In another embodiments, such a device is provided that comprises a first semiconductor chip including a plurality of first terminals, a plurality of second terminals, and a first circuit coupled between the first and second terminals and configured to control combinations of the first terminals to be electrically connected to the second terminals; and a second semiconductor chip including a plurality of third terminals coupled respectively to the second terminals, an internal circuit, and a second circuit coupled between the third terminals and the internal circuit and configured to activate the internal circuit when a combination of signals appearing at the third terminals indicates a chip selection.

In still another embodiment, a device comprises a first semiconductor chip and a plurality of second semiconductor chips. The first semiconductor chip comprises a plurality of first terminals supplied with a plurality of first signals, respectively, a plurality of second terminals that are smaller in number than the first terminals, a mode register temporarily storing mode information, the mode information taking a selected one of first and second modes, and a connection control circuit coupled to the first and second terminals and the mode register and configured to electrically connect first selected ones of the first terminals respectively to the second terminals in response to the mode information taking the first mode and second selected ones of the first terminals respectively to the second terminals in response to the mode information taking the second mode, the first selected ones being different from the second selected ones. Each of the second semiconductor chips comprises a plurality of third terminals coupled to the second terminals of the first semiconductor chip, a data storage circuit, a chip address storage circuit storing a chip address, a comparison circuit coupled to the third terminals and the chip address storage circuit and configured to compare information derived from the third terminals with the chip address stored in the chip address storage circuit and produce an access allowance signal when the information and the chip address are coincident with each other, and an access circuit responding to the access allowance signal and performing data read and write operations on the data storage circuit.

BRIEF DESCRIPTION OF THE DRAWINGS

FIG. 7 is a table indicative of an embodiment of a relation between the operation modes and chip selection addresses;

FIGS. 15A to 15C are circuit diagrams of a chip selection address generating circuit 42, in which FIG. 15A shows a multiplexer 42a that generates a bit SID0, FIG. 15B shows a multiplexer 42b that generates a bit SID1, and FIG. 15C shows a multiplexer 42c that generates a bit SID2;

DETAILED DESCRIPTION OF THE EMBODIMENTS

Preferred embodiments of the present invention will be explained below in detail with reference to the accompanying drawings.

Figure 1:
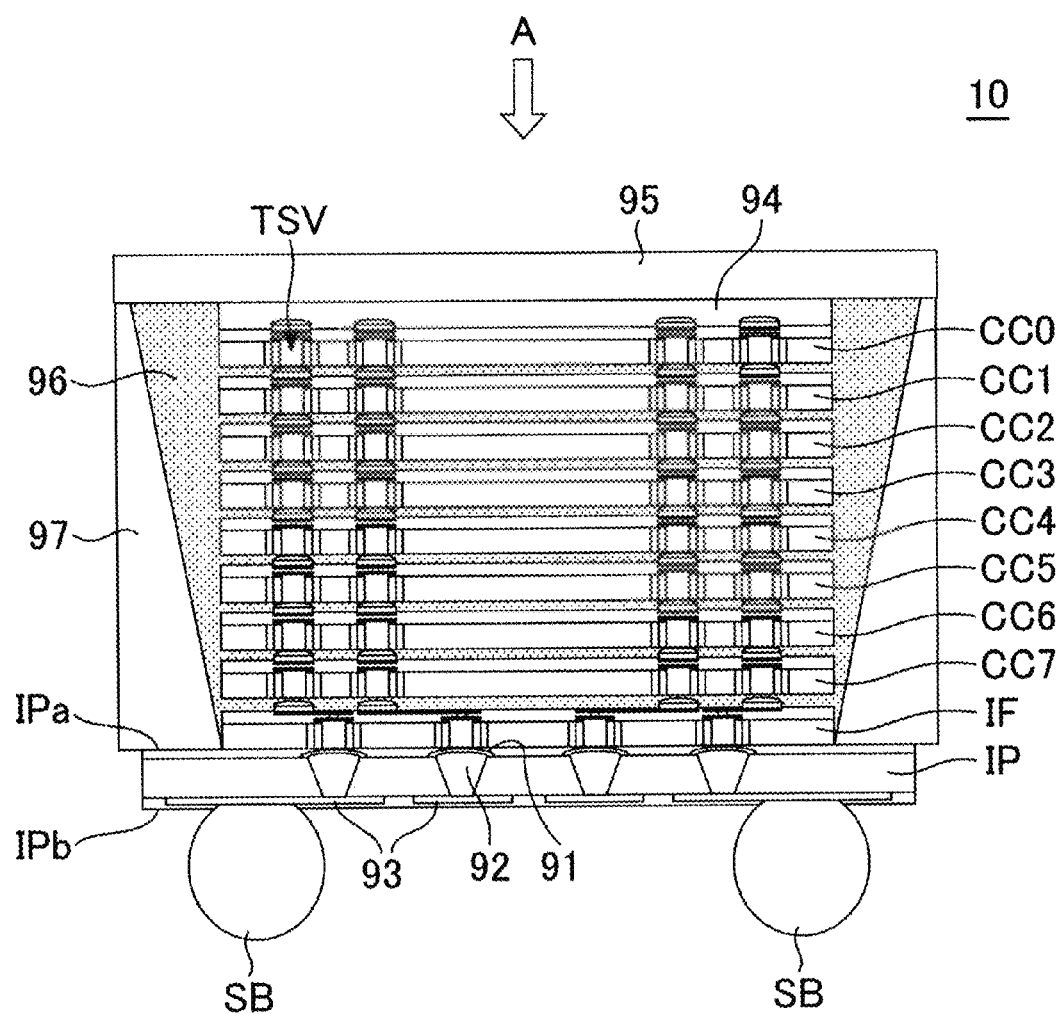
FIG. 1 is a schematic cross-sectional view for explaining a structure of a semiconductor device 10 according to an embodiment of the present invention.

Referring now to FIG. 1, the semiconductor device 10 according to this embodiment has the structure where eight core chips (memory chips) CC0 to CC7 and an interface chip IF are stacked on an interposer IP. The core chips CC0 to CC7 have the same function and structure as one another. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 are manufactured using the same manufacture mask whereas the interface chip IF is manufactured using a manufacture mask different from that of the core chips CC0 to CC7. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon via may be referred to as a penetration electrode. The uppermost core chip CC0 may not have the through silicon via TSV. Meanwhile, the interposer IP is a circuit board that is made of a resin, and plural external terminals (solder balls) SB are formed in a back surface IPb of the interposer IP.

Each of the core chips CC0 to CC7 is a semiconductor chip on which only a back end unit of the circuit blocks included in the ordinary stand-alone SDRAM (Synchronous Dynamic Random Access Memory) normal is integrated. That is, each of the core chips CC0 to CC7 does not have a front end unit. As the circuit blocks included in the front end unit, a parallel-serial converting circuit that performs parallel/serial conversion on input/output data between a memory cell array and a data input/output terminal and a DLL (Delay Locked Loop) circuit that controls input/output timing of data are exemplified, which will be described in detail below.

On the other hand, the interface chip IF is a semiconductor chip on which only the front-end unit of the circuit blocks included in the normal stand-alone SDRAM is integrated. The interface chip IF functions as a common front end unit for the eight core chips CC0 to CC7. Accordingly, all external accesses are performed through the interface chip IF and inputs/outputs of data are also performed through the interface chip IF.

In this embodiment, the interface chip IF is disposed between the interposer IP and the core chips CC0 to CC7. However, the position of the interface chip IF is not restricted in particular. The interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
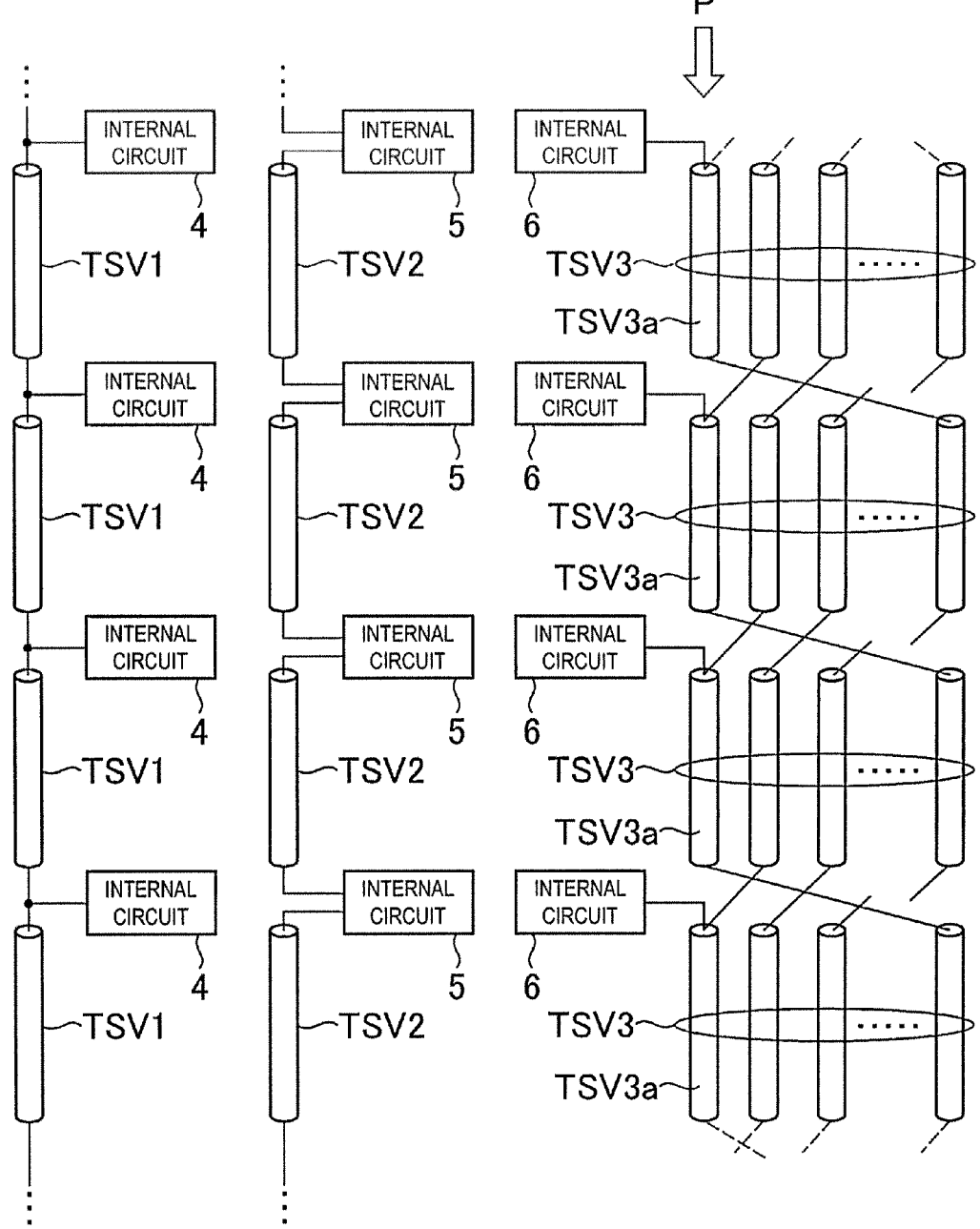
FIGS. 2A to 2C are diagrams indicative of an embodiment of various types of through silicon via TSV provided in a core chip.

When the through silicon vias TSV provided in the core chips CC0 to CC7 are two-dimensionally viewed from a lamination direction, that is, viewed from an arrow A shown in FIG. 1, most of the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Meanwhile, as shown in FIG. 2B, the a part of the through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, chip address information to be described below is exemplified.

Another part of the through silicon vias TSV is short-circuited from the through silicon vias TSV of other layer provided at the different position in plain view, as shown in FIG. 2C. With respect to this kind of through silicon vias TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information is exemplified.

As such, three types of through silicon vias TSV1 to TSV3 shown in FIGS. 2A to 2C are provided in the core chips CC0 to CC7. As described above, most of the through silicon vias TSV are of a type shown in FIG. 2A, and an address signal and a command signal, and the like are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 whereas the core chips CC0 to CC7 have the same structure as one another.

Figure 3:
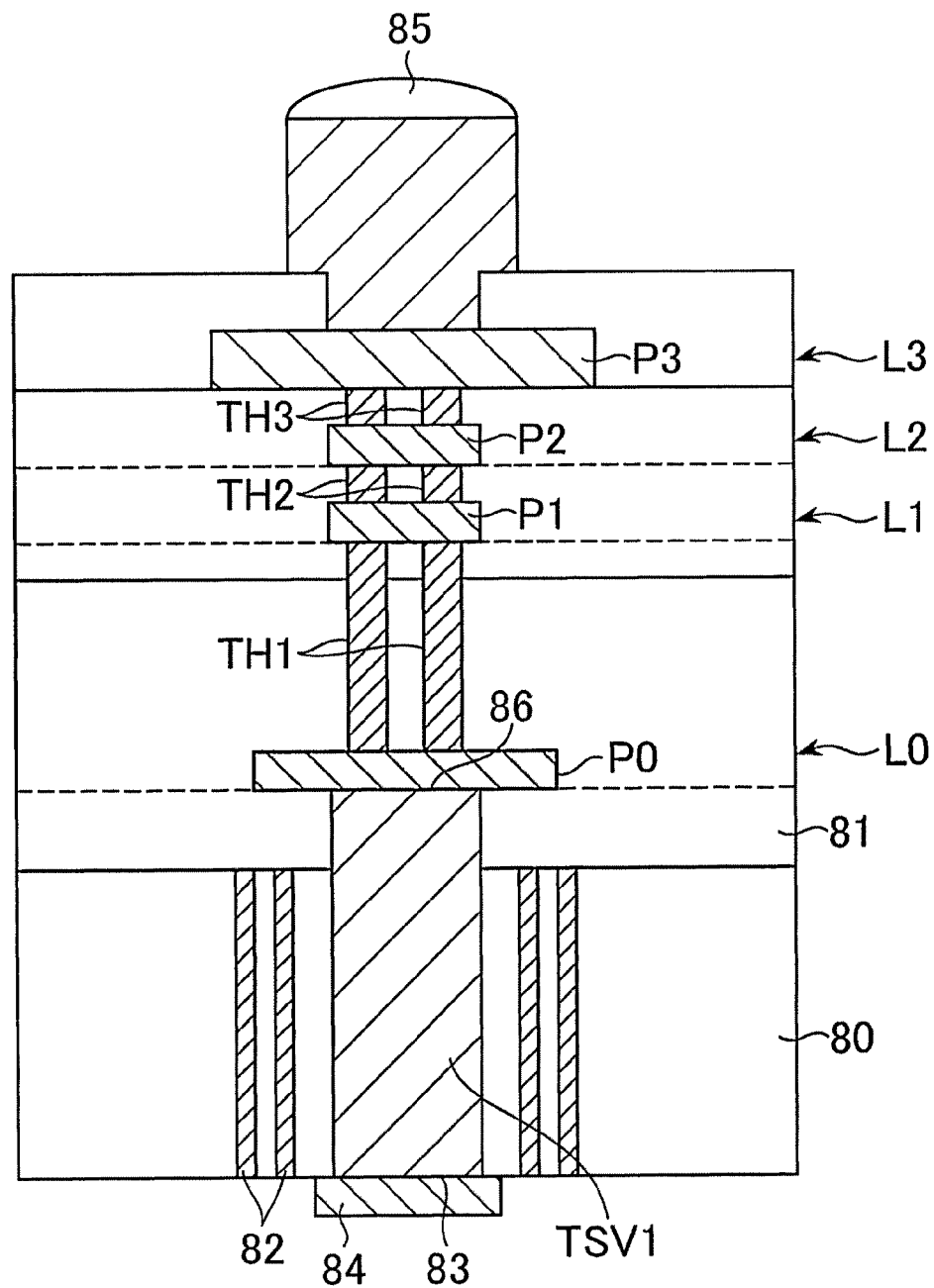
FIG. 3 is a cross-sectional view indicative of an embodiment of a structure of the through silicon via TSV1 of the type shown in FIG. 2A.

Turning to FIG. 3, the through silicon via TSV1 is provided to penetrate a silicon substrate 80 and an interlayer insulating film 81 provided on a surface of the silicon substrate 80. An insulating ring 82 is provided around the through silicon via TSV1. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
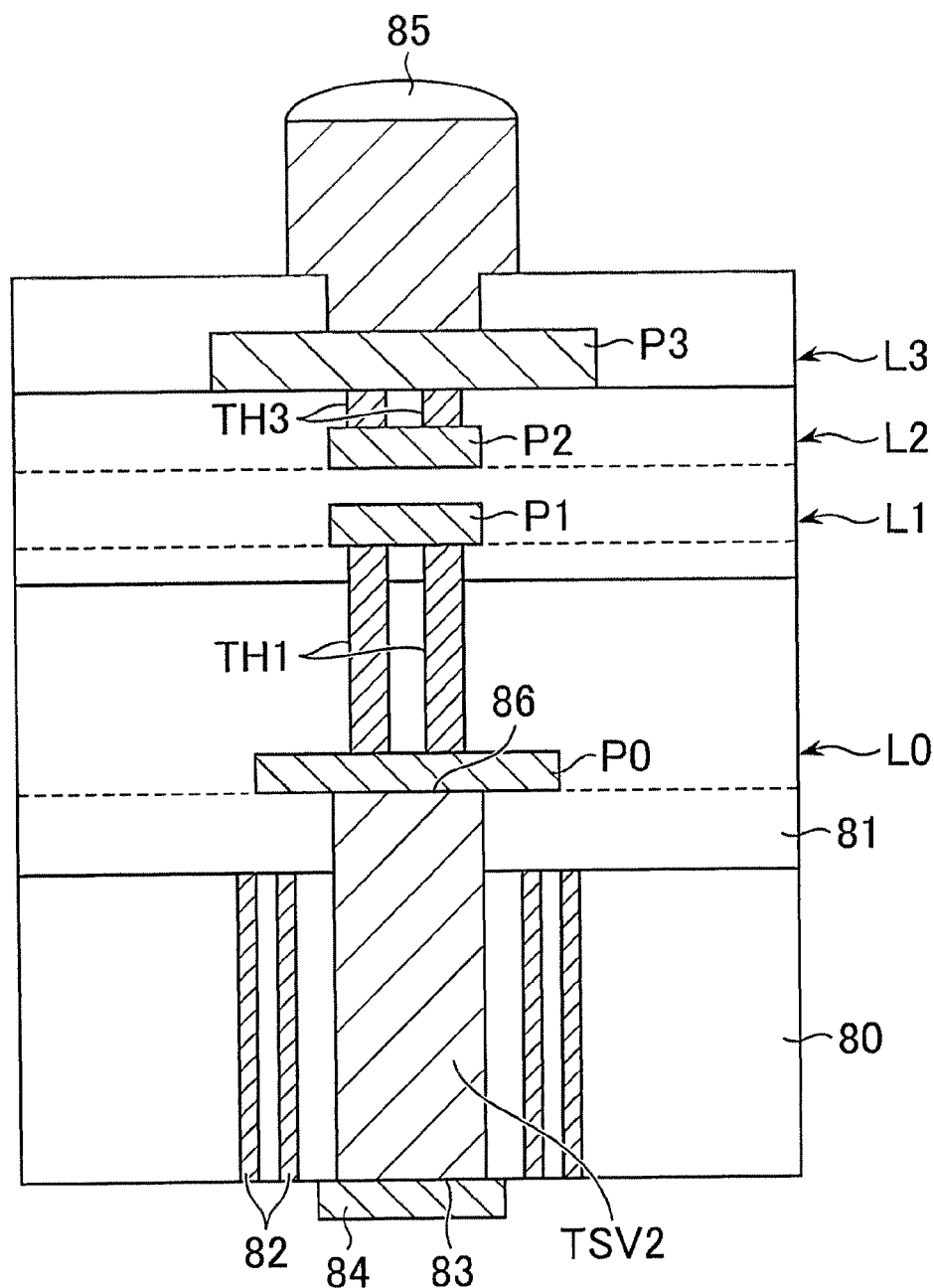
FIG. 4 is a cross-sectional view indicative of an embodiment of a structure of the through silicon via TSV2 of the type shown in FIG. 2B.

Turning to FIG. 4, the through silicon via TSV2 is different from the through silicon via TSV1 shown in FIG. 3 in that the through hole electrodes TH2 that directly connect the pads P1 and P2 located at the same plan position to each other are deleted. The pad P1 is connected to, for example, an output node of the internal circuit 5 shown in FIG. 2, and the pad P2 is connected to, for example, an input node of the internal circuit 5 shown in FIG. 2. This causes the respective internal circuits 5 provided in the core chips CC0 to CC7 to be cascaded through the through silicon vias TSV2.

Figure 5:
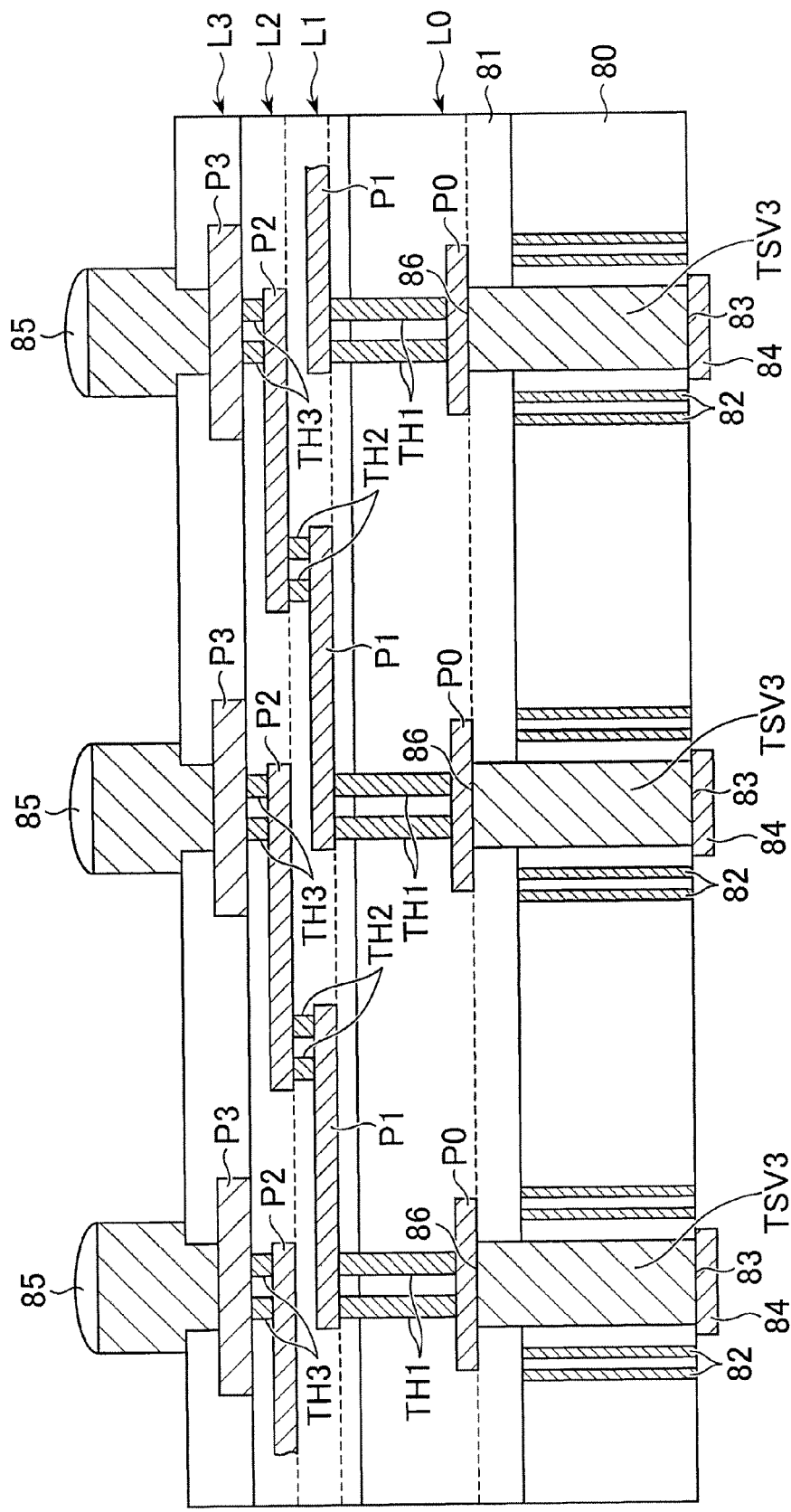
FIG. 5 is a cross-sectional view indicative of an embodiment of a structure of the through silicon via TSV3 of the type shown in FIG. 2C.
Figure 6:
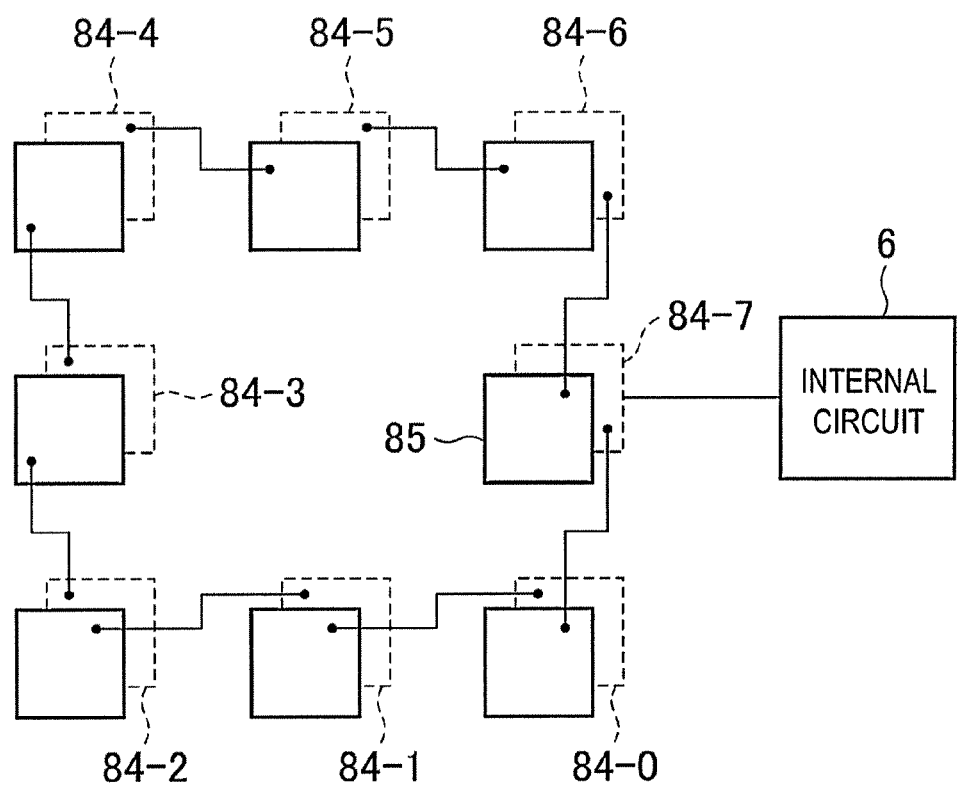
FIG. 6 is a schematic diagram for explaining a connection relation between through silicon vias TSV3 in respective core chips.

Turning to FIG. 5, in the through silicon vias TSV3, not the pads P1 and P2 located at the same plan position but the pads P1 and P2 located at different plan positions are connected by the though hole electrodes TH2. Although only three through silicon vias TSV3 are shown in FIG. 5, the through silicon vias TSV3 are provided in each of the core chips CC0 to CC7 by the number of core chips per signal (that is, eight). The eight through silicon vias TSV3 are connected cyclically as shown in FIG. 6. In FIG. 6, the front bumps 85 are shown by solid lines and the back bumps 84 are shown by broken lines. When the through silicon vias TSV3 are connected cyclically as shown in FIG. 6, different information can be supplied to each of the core chips CC0 to CC7 from the interface chip IF while the core chips CC0 to CC7 have the same circuit configuration. For example, when the internal circuit 6 is connected at the position of the back bump 84-7, signals supplied from the interface chip IF to the back bumps 84-0 to 84-7 of the lowermost core chip CC7 are selectively supplied to the internal circuits 6 of the core chips CC0 to CC7, respectively.

Before detailed circuit structures of the interface chip IF and the core chips CC0 to CC7 are described, an address allocation in a semiconductor device 10 according to the present embodiment will be described.

The semiconductor device 10 according to the present embodiment can change the address allocation by a mode selection. There are roughly prepared an LRA (Logical Rank Address) mode and a PRA (Physical Rank Address) mode in the semiconductor device 10. The LRA mode is an address allocation system in which plural physical banks mounted to the different core chips CC0 to CC7, respectively, are handled as one logical bank by a controller. On the other hand, the PRA mode is an address allocation system in which each of the plural physical banks mounted to the respective core chips CC0 to CC7 is handled as one logical bank. In the present embodiment, there are three types in the LRA mode. Each of three types is referred to as LRA-1 system, LRA-2 system, and LRA-3 system, for the sake of convenience. In the present embodiment, there are two types in the PRA mode, which are referred to as a PRA-1 system and a PRA-2 system for convenience sake. The respective systems will specifically be described below.

In the present embodiment, there are also a 1-rank mode and a 2-rank mode. The 1-rank mode is an operation mode in which all of the core chips CC0 to CC7 constitute one address space. The 2-rank mode is an operation mode in which the core chips CC0 to CC7 are divided into two ranks having the same address space. When the semiconductor device 10 operates in the 2-rank mode, a chip selection signal is used to select a rank. When there is a plural-rank mode in the present invention, the number of ranks is not limited to two and can be four or more.

In the present embodiment, there are also a 1-kbyte mode and a 2-kbyte mode. The 1-kbyte mode is an operation mode in which one core chip is selected at the time of a row access and memory cells of 1 kilobyte are selected in the selected core chip. The 2-kbyte mode is an operation mode in which two core chips are simultaneously selected at the time of a row access and memory cells of 2 kilobytes are accordingly selected. When the semiconductor device 10 operates in the 2-kbyte mode, one of the two selected core chips is selected at the time of a column access. Values such as 1 kilobyte and 2 kilobytes are illustrative and the number of memory cells to be selected at the time of a row access is not particularly limited.

In the present embodiment, there are also a ×8-bit mode and a ×4-bit mode. The ×8-bit mode is an operation mode in which eight-bit data are simultaneously input or output between the interface chip IF and the outside. The ×4-bit mode is an operation mode in which four-bit data are simultaneously input or output between the interface chip IF and the outside. Values such as 8 bits and 4 bits are illustrative and the number of bits of data to be simultaneously input or output between the interface chip IF and the outside is not particularly limited.

These operation modes are selected by a mode signal, which will be explained later. Because the semiconductor device 10 according to the present embodiment has the LRA mode/the PRA mode, the 1-rank mode/the 2-rank mode, the 1-kbyte mode/the 2-kbyte mode, and the ×8-bit mode/the ×4-bit mode as described above, one of 16 operation modes in total can be selected. Although not particularly limited, selection of an operation mode is performed by storing the operation mode in a nonvolatile memory element such as a fuse element at the time of manufacturing the interface chip IF.

Turning to FIG. 7, the chip selection addresses are used to select the core chips CC0 to CC7. That is, unique chip addresses (first chip addresses) are allocated to the core chips CC0 to CC7, respectively. One of the core chips having the chip address that matches a chip selection address (second chip address) supplied from the interface chip IF is selected accordingly.

As shown in FIG. 7, the chip selection address SID is a 3-bit signal composed of SID0 to SID2. In the present specification, there are cases where the chip selection address supplied from the interface chip IF is referred to as "SID(IF)" and the chip addresses unique to the core chips CC0 to CC7 are referred to as "SID(CORE)" to distinguish therebetween.

A signal to be used as the bit SID0 among the bits SID0 to SID2 that compose the chip selection signal SID is changed according to whether a selected operation mode is the LRA mode or the PRA mode. Specifically, one bit (X15) of a row address is used as SID0 when the semiconductor device 10 operates in the LRA mode, and one bit (C0) of a chip selection signal is used as SID0 when the semiconductor device 10 operates in the PRA mode. The chip selection signal is a kind of address supplied from outside when the PRA mode is selected.

A signal to be used as the bit SID1 is changed according to whether a selected operation mode is the LRA mode or the PRA mode, the 1-kbyte mode or the 2-kbyte mode, or the ×8-bit mode or the ×4-bit mode. Specifically, one bit (X16) of a row address is used as SID1 when the semiconductor device 10 operates in the LRA mode and the 1-kbyte mode, one bit (Y11) of a column address is used as SID1 when the semiconductor device 10 operates in the LRA mode, the 2-kbyte mode, and the ×8-bit mode, and one bit (Y13) of a column address is used as SID1 when the semiconductor device 10 operates in the LRA mode, the 2-kbyte mode, and the ×4-bit mode. When the semiconductor device 10 operates in the PRA mode, one bit (C1) of the chip selection signal is used as SID1.

A signal to be used as the bit SID2 is changed according to whether a selected operation mode is the LRA mode or the PRA mode, or the 1-rank mode or the 2-rank mode. Specifically, one bit (X17) of a row address is used as SID2 when the semiconductor device 10 operates in the LRA mode and the 1-rank mode, and one bit (C2) of the chip selection signal is used as SID2 when the semiconductor device 10 operates in the PRA mode and the 1-rank mode. When the semiconductor device 10 operates in the 2-rank mode, the chip selection signal CS1 is used as SID2.

As described above, the signals to be used as the chip selection address SID(IF) vary according to the operation modes. Therefore, if generation of the chip selection address SID is performed on the side of the core chips CC0 to CC7, all signals possibly used (nine bits in total) need to be supplied from the interface chip IF to the core chips CC0 to CC7. In such cases, at least nine through silicon vias TSV are necessary. In contrast to this, the semiconductor device 10 according to the present embodiment performs generation of the chip selection address SID(IF) on the side of the interface IF. Accordingly, three through silicon vias TSV suffice to supply the chip selection address SID(IF) to the core chips CC0 to CC7 and the number of through silicon vias TSV to be used can be reduced. A circuit scale of a comparison circuit that compares the chip address SID(CORE) with the chip selection address SID(IF) is also reduced, which enables a chip area of the core chips CC0 to CC7 to be also reduced. This point is explained later.

Figure 8:
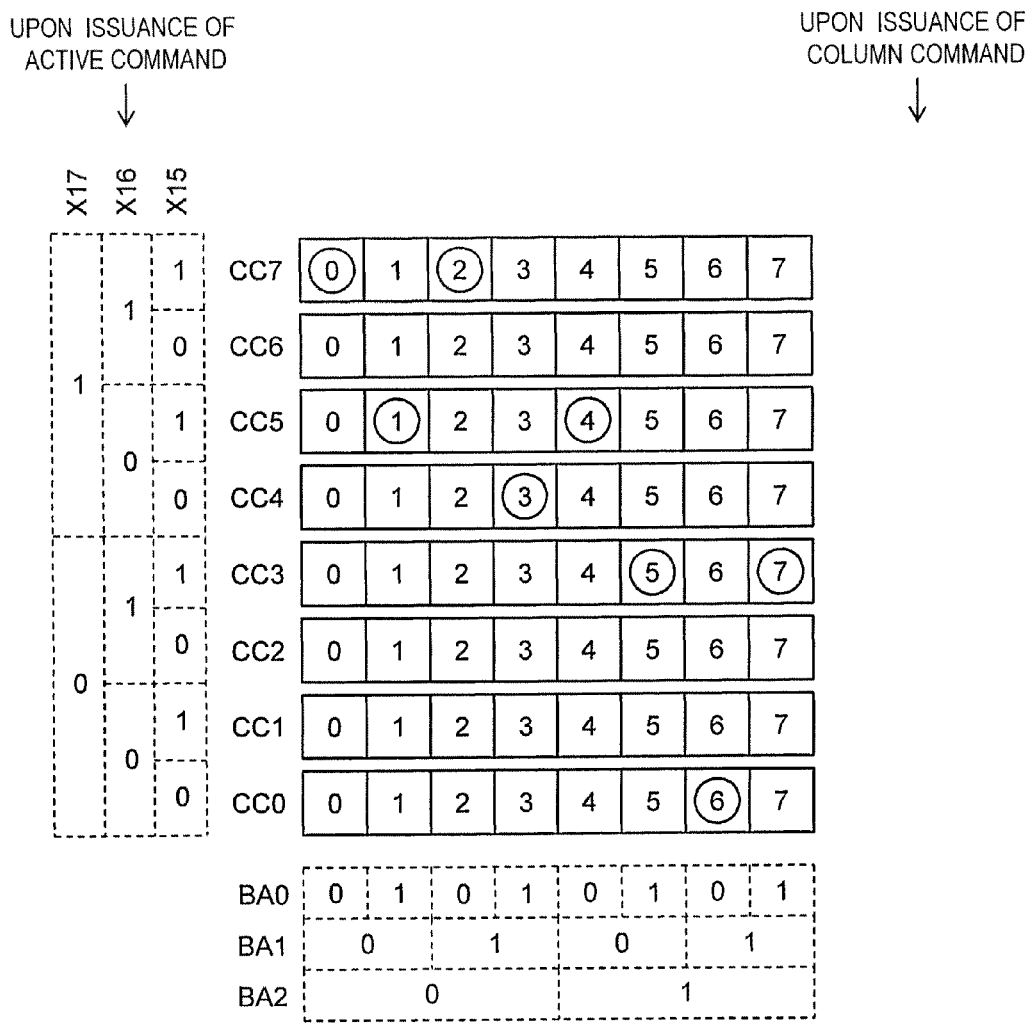
FIG. 8 is a schematic diagram for explaining address allocation when the operation mode of an LRA-1 system shown in FIG. 7 is selected.

Turning to FIG. 8, the LRA-1 system corresponds to a case where the semiconductor device 10 operates in the LRA mode, the 1-rank mode, and the 1-kbyte mode. In FIG. 8 to 12, one grid indicates one physical bank. Therefore, it turns out that one core chip includes physical banks 0 to 7.

As shown in FIG. 8, when the semiconductor device 10 operates in the LRA-1 system, any one of the core chips CC0 to CC7 is selected based upon a part of an address signal, which is X17, X16, and X15 (chip address), supplied during a row-access (upon an issuance of an active command ACT), and any one of banks 0 to 7 is selected based upon bank address signals BA0 to BA2 supplied during the row access and a column access. The controller recognizes 8 physical banks, included in the different core chips CC0 to CC7 and having the same number, as one logical bank.

In this system, the chip selection address is not supplied during the column access (upon the issuance of a column command). However, since the controller recognizes 8 physical banks, included in the different core chips CC0 to CC7 and having the same number, as one logical bank, the controller can identify to which one of the core chips CC0 to CC7 the column access is made during the column access, even if the chip selection address is not supplied. Because there is inevitably one core chip in which the logical bank designated upon the column access is in an active state.

For example, it is supposed that the encircled physical banks are in the active state in FIG. 8. If the designated logical bank upon the column access is the bank 0, the column access is made to the core chip CC7 in which the bank 0 is in the active state. If the designated logical bank upon the column access is the bank 1, the column access is made to the core chip CC5 in which the bank 1 is in the active state.

As described above, the selection of the core chips CC0 to CC7 is made during the row access in the LRA-1 system. The controller recognizes the core chips CC0 to CC7 as one DRAM, so that a chip selection signal (CS) to be used is also 1 bit. Therefore, the number of memory cells accessed by one row access becomes 1 kilobyte, and the number of the rank becomes 1.

Figure 9:
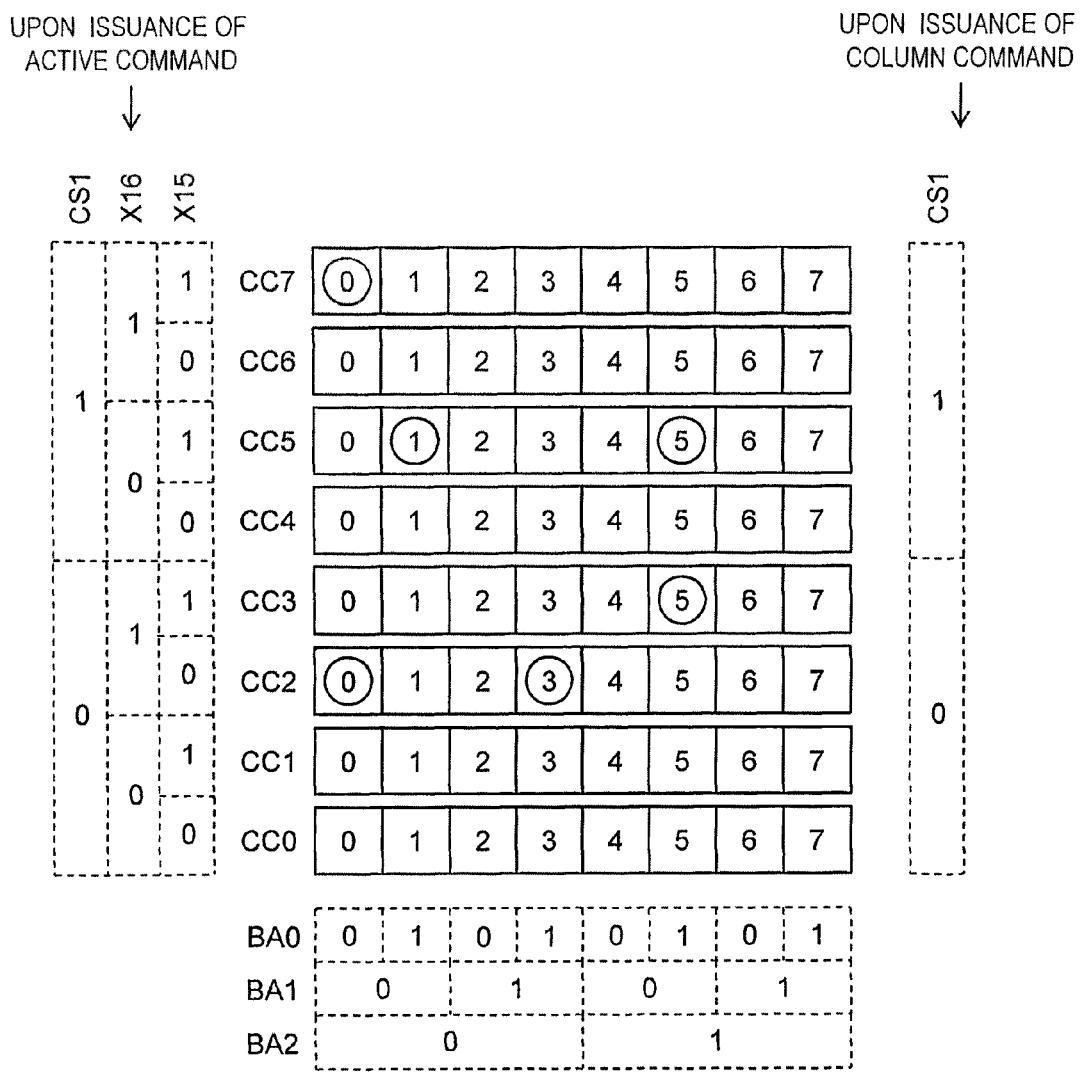
FIG. 9 is a schematic diagram for explaining address allocation when the operation mode of an LRA-2 system shown in FIG. 7 is selected.

Turning to FIG. 9, the LRA-2 system corresponds to a case where the semiconductor device 10 operates in the LRA mode, the 2-rank mode, and the 1-kbyte mode.

As shown in FIG. 9, when the semiconductor device 10 operates in the LRA-2 system, the core chips CC0 to CC3 or the core chips CC4 to CC7 are selected based upon a chip selection signal CS1, and any one of selected 4 core chips is selected based upon a part of an address signal, which is X15 and X16, supplied during a row-access. The bank address signals BA0 to BA2 are supplied during both the row access and the column access.

In this system, the core chips CC0 to CC3 or the core chips CC4 to CC7 are selected by using the chip selection signal CS1, so that the rank number viewed from the controller becomes 2. Like the LRA-1 system, the selection of the core chips CC0 to CC7 is determined during the row access, so that the number of memory cells accessed by one row access becomes kilobyte, as in the LRA-1 system. Although the chip selection address is not supplied during the column access, a problem is not caused with this situation, as in the LRA-1 system.

In this system, the core chips CC0 to CC3 and the core chips CC4 to CC7 are identified by the chip selection signals CS0 and CS1. Therefore, the banks belonging to the core chips CC0 to CC3 and the banks belonging to the core chips CC4 to CC7 are handled as different logical banks by the controller. Accordingly, the bank 0 in the core chip CC2 and the bank 0 in the core chip CC7 can be simultaneously brought into the active state as in the example in FIG. 9.

While the 1-bit chip selection signal is used because the number of ranks is two in the LRA-2 system of the present example, a chip selection signal of two or more bits is used when the number of ranks is four or more. That is, when the semiconductor device 10 operates in a plural-rank mode, it suffices that n-k bits of an address signal and a k-bit chip selection signal are used as an n-bit chip selection address SID(IF).

Figure 10:
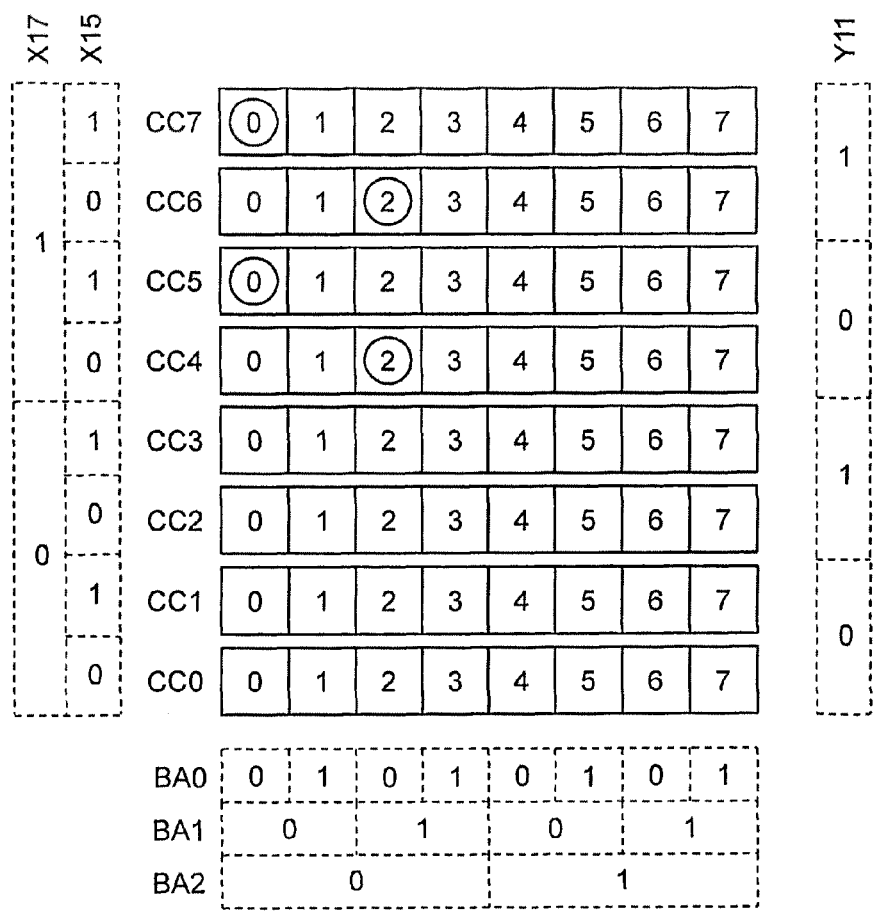
FIG. 10 is a schematic diagram explaining address allocation when an operation mode of an LRA-3 system shown in FIG. 7 is selected.

Turning to FIG. 10, the LRA-3 system corresponds to a case where the semiconductor device 10 operates in the LRA mode, the 1-rank mode, the 2-kbyte mode, and the ×8-bit mode.

As shown in FIG. 10, when the semiconductor device 10 operates in the LRA-3 system, any one set of the core chips CC0 and CC2, the core chips CC1 and CC3, the core chips CC4 and CC6, and the core chips CC5 and CC7 is selected based upon a part of the address signals, which is X15 and X17, supplied during the row access, and either one of the selected two core chips is selected based upon a part of the address signals, which is Y11, supplied during the column access. The bank address signals BA0 to BA2 are supplied during both the row access and the column access.

In this system, the selection of the core chips CC0 to CC7 is made based upon the part of the address signals, which is X17 and X15, supplied during the row access, and a part of the address signals, which is Y11, supplied during the column access. Therefore, the chip selection address becomes X17, X15, and Y11. Since two core chips are in the active state during the row access, the number of memory cells accessed by one row access becomes double that in the LRA-1 system and LRA-2 system. It is 2 kilobytes.

Figure 11:
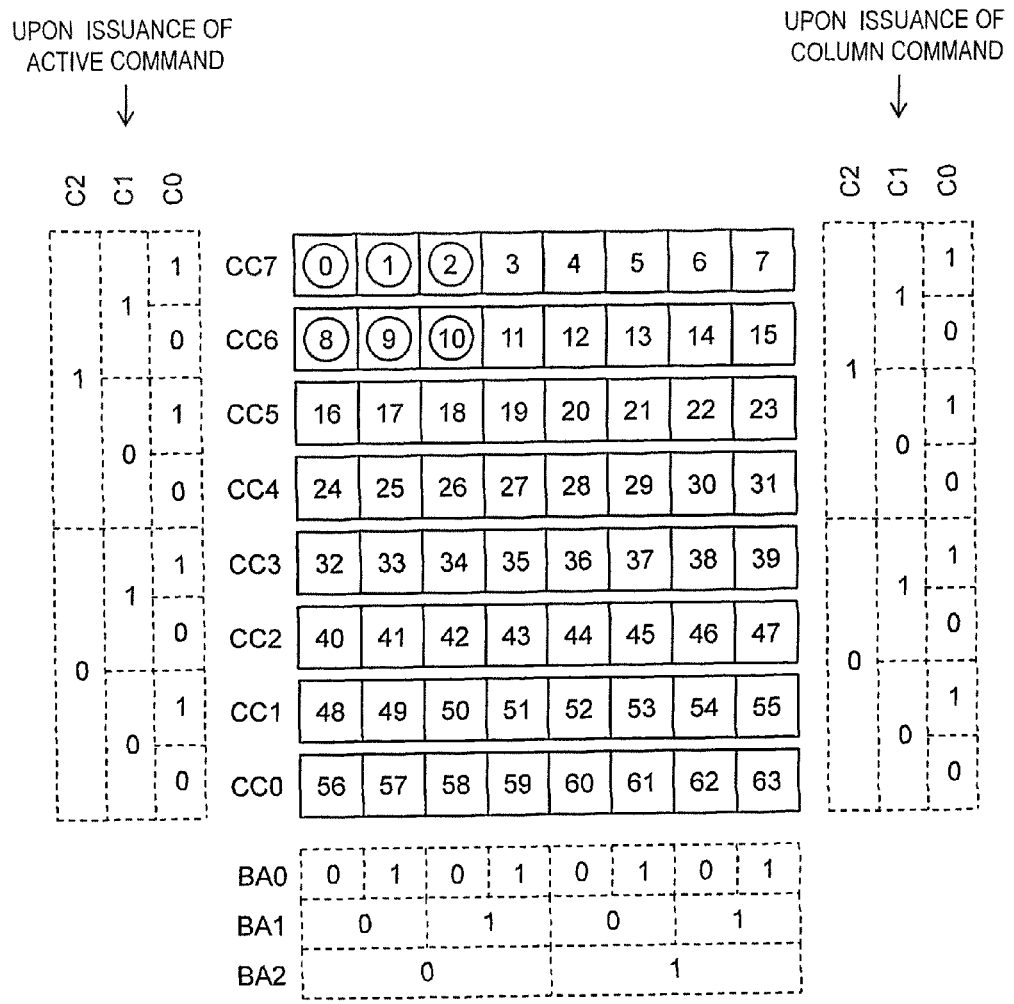
FIG. 11 is a schematic diagram for explaining address allocation when an operation mode of a PRA-1 system shown in FIG. 7 is selected.

Turning to FIG. 11, the PRA-1 system corresponds to a case where the semiconductor device 10 operates in the PRA mode and the 1-rank mode.

As shown in FIG. 11, when the semiconductor device 10 operates in the PRA-1 system, chip selection addresses C0 to C2 and the bank address signals BAD to BA2 are supplied during both the row access and the column access. In this system, the controller recognizes all physical banks as different logical banks. Specifically, the controller recognizes 64 banks in the present embodiment. Therefore, the number and the combination of the banks, which become the active state, is optional, wherein the maximum of 64 banks can be brought into the active state.

Figure 12:
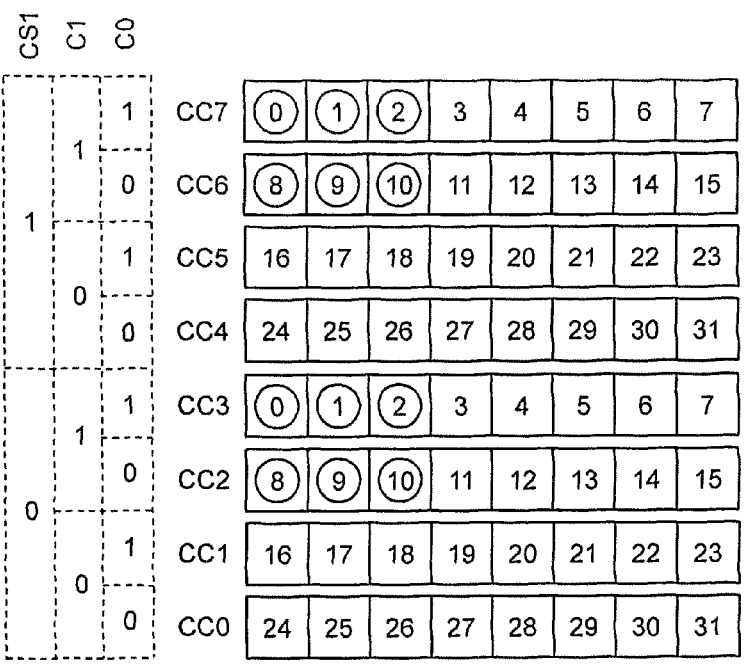
FIG. 12 is a schematic diagram for explaining address allocation when an operation mode of a PRA-2 system shown in FIG. 7 is selected.
Figure 12:
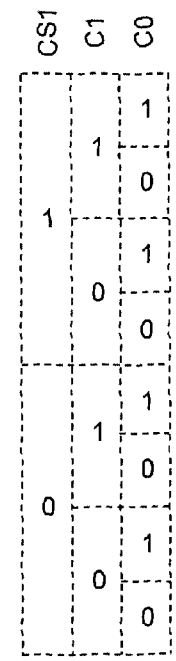

Turning to FIG. 12, the PRA-2 system corresponds to a case where the semiconductor device 10 operates in the PRA mode and the 2-rank mode.

As shown in FIG. 12, when the semiconductor device 10 operates in the PRA-2 system, either the core chips CC0 to CC3 or the core chips CC4 to CC7 are selected based on the chip selection signal CS1, and the chip selection addresses C0 and C1 and the bank address signals BA0 to BA2 are supplied at the time of both of a row access and a column access.

Because either the core chips CC0 to CC3 or the core chips CC4 to CC7 are selected using the chip selection signal CS1 in this system, the number of ranks as viewed from the controller is two. The controller recognizes the physical banks included in each rank as different logical banks. That is, in the present embodiment, the controller recognizes 32 banks per one rank. Therefore, the number and the combination of the banks, which become the active state, is optional, wherein the maximum of 32 banks per one rank can be brought into the active state.

The above description is the detail of the respective address allocation systems. The address allocation systems can be changed by the mode selection. However, because it is unlikely that users need to change the operation modes in practical use, it is preferable to perform selection of a mode at the manufacturing stage.

A specific circuit configuration of the semiconductor device 10 is explained next.

Figure 13:
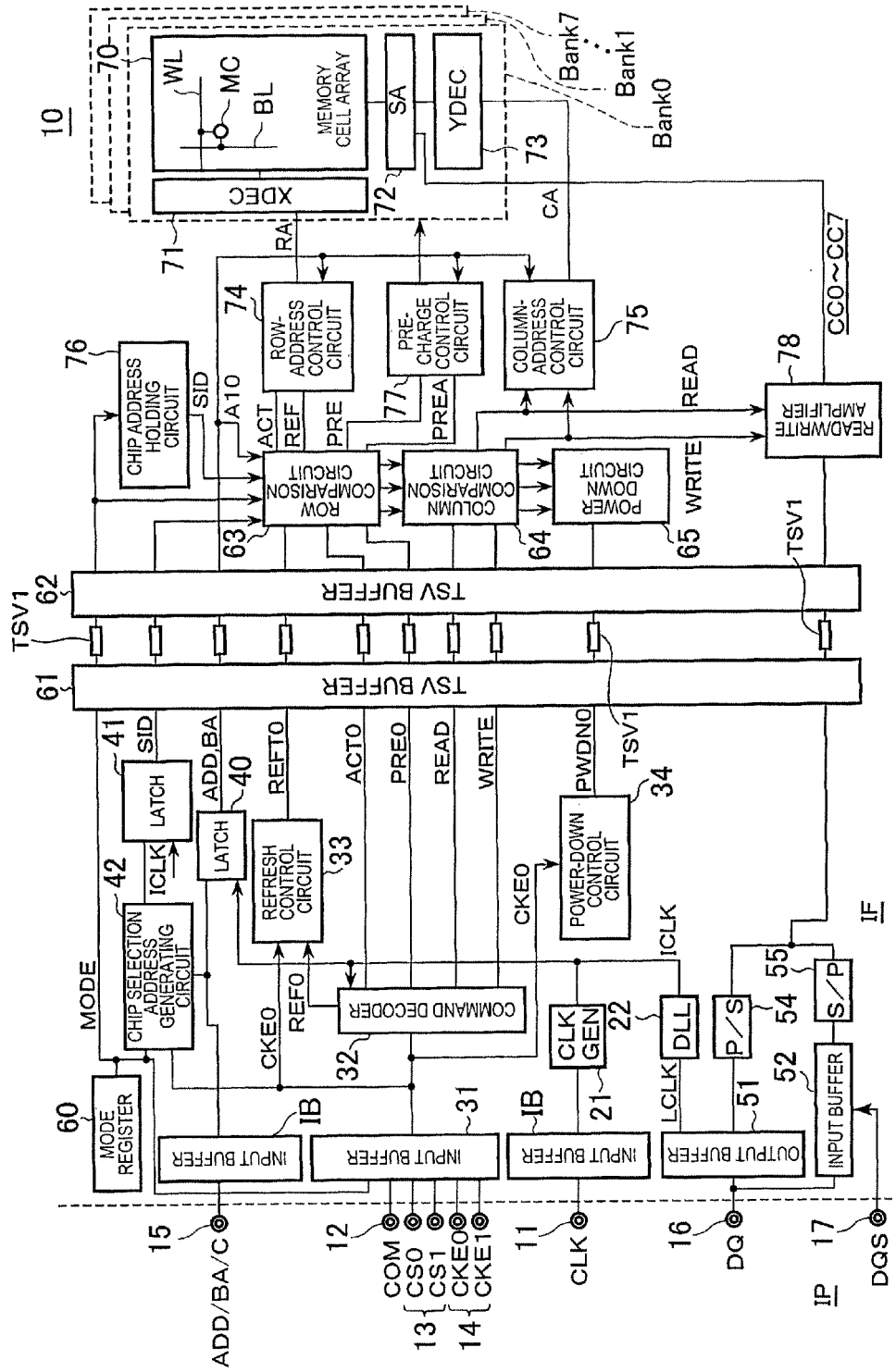
FIG. 13 is a block diagram indicative of an embodiment of a configuration of the semiconductor device 10 according to the embodiment of the present invention.

Turning to FIG. 13, external terminals provided in the interposer IP include a clock terminal 11, a command terminal 12, chip select terminals 13, clock enable terminals 14, an address terminal 15, a data input/output terminal 16, and a data strobe terminal 17. Although other terminals such as a calibration terminal and a power supply terminal are also provided, they are not shown. All the external terminals other than the power supply terminal are connected to the interface chip IF and are not directly connected to the core chips CC0 to CC7.

The clock terminal 11 is supplied with an external clock signal CLK. The external clock signal CLK is supplied to a clock generation circuit 21 through an input buffer IB. The clock generation circuit 21 generates an internal clock signal ICLK. The internal clock signal ICLK is supplied to various circuit blocks in the interface chip IF.

The internal clock signal ICLK is supplied to a DLL circuit 22. The DLL circuit 22 generates an output clock signal LCLK. The output clock signal LCLK is supplied to an output buffer circuit 51.

The command terminal 12 is supplied with a command signal COM including a row address strobe signal RASB, a column address strobe signal CASB, a write enable signal WEB, and the like. The chip select terminal 13 is supplied with the chip selection signals CS0 and CS1. The clock enable terminal is supplied with clock enable signals CKE0 and CKE1. However, when the semiconductor device 10 operates in the 1-rank mode, the chip selection signal CS1 and the clock enable signal CKE1 are not used. These signals are used when the semiconductor device 10 operates in the 2-rank mode in which the number of ranks is two.

The command signal, the chip selection signals, and the clock enable signals are supplied to a command decoder 32 through an input buffer 31.

The command decoder 32 decodes the command signal COM output from the input buffer 31 to generate various internal signals. The internal signals output from the command decoder 32 include an active signal ACT0, a precharge signal PRE0, a read signal READ, and a write signal WRITE. These internal signals are supplied to the core chips CC0 to CC7 in common through a TSV buffer 61 and the through silicon vias TSV1. The read signal READ and the write signal WRITE are output from the command decoder 32 after a predetermined latency has elapsed in a latency counter (not shown). The latency for the read signal READ and the write signal WRITE is set in an additive latency AL. A value of the additive latency AL can be changed according to a set value in a mode register 60.

The internal signals generated by the command decoder 32 also include a refresh signal REF0. The refresh signal REF0 is generated when a combination of the command signal COM indicates a refresh command. The refresh signal REF0 is supplied to a refresh control circuit 33 shown in FIG. 13. The refresh control circuit 33 generates a refresh signal REFT0 based on the refresh signal REF0 and the clock enable signal CKE0. The refresh signal REFT0 is supplied to the core chips CC0 to CC7 in common through the TSV buffer 61 and the through silicon via TSV1.

The address terminal 15 is supplied with an address signal ADD, a bank address signal BA and a chip selection signal C. The address signal ADD, bank address signal BA and chip selection signal C are supplied to an address latch circuit 40 and a chip selection address generating circuit 42 through an input buffer IB.

The chip selection address generating circuit 42 generates the chip selection address SID(IF) from the address signal according to a mode signal MODE output from the mode register 60. Which bit of the address signal is used as the chip selection address SID(IF) is as explained with reference to FIG. 7. Details of the chip selection address generating circuit 42 are explained later.

The chip address SID output from the chip selection address generating circuit 42 is latched by a latch circuit 41 synchronously with the internal clock signal ICLK. The chip selection address SID(IF) latched by the latch circuit 41 is supplied to the core chips CC0 to CC7 in common through the TSV buffer 61, the through silicon via TSV, and a TSV buffer 62. The address latch circuit 40 latches the address signal ADD, which is not used as the chip selection address SID(IF), and the bank address signal BA synchronously with the internal clock signal ICLK and supplies the latched signals to the core chips CC0 to CC7 in common through the TSV buffer 61, the through silicon vias TSV, and the TSV buffer 62.

The data input/output terminal 16 is a terminal for inputting or outputting read data DQ or write data DQ, and is connected to the output buffer circuit 51 and an input buffer circuit 52. The output buffer circuit 51 receives read data supplied through a parallel-serial converting circuit 54 and outputs the received read data to the data input/output terminal 16 synchronously with the output clock signal LCLK. The input buffer circuit 52 receives write data supplied through the data input/output terminal 16 and outputs the received write data to a serial-parallel converting circuit 55. The operation of the input buffer circuit 52 is performed synchronously with a data strobe signal DQS supplied through the data strobe terminal 17. The parallel-serial converting circuit 54 converts parallel read data supplied from the core chips CC0 to CC7 through the through silicon vias TSV1 into serial data. The serial-parallel converting circuit 55 converts serial write data supplied from the input buffer circuit 52 into parallel data.

In this way, parallel data which are not converted into serial data are basically input or output between the core chips CC0 to CC7 and the interface chip IF. That is, while data input/output to/from outside of the chip is performed serially (that is, one data input/output terminal is used for one data DQ) in the ordinary SDRAM that can operate alone, data input/output is performed in parallel between the core chips CC0 to CC7 and the interface chip IF. This point is an important difference between the ordinary SDRAM and the core chips CC0 to CC7. However, it is not essential to input/output all the prefetched parallel data using different through silicon vias TSV, respectively, and the number of through silicon vias TSV required for one data DQ can be reduced by performing partial parallel-serial conversion on the side of the core chips CC0 to CC7. For example, transfer of the read data or the write data between the interface chip IF and the core chips CC0 to CC7 can be performed in twice.

While the same through silicon vias TSV1 are used for the read data and the write data in this embodiment, through silicon vias TSV1 dedicated for the read data and through silicon vias TSV1 dedicated for the write data can be also used. In this case, the read data and the write data are transferred through different signal paths and thus no conflict of the read data and the write data between different ranks occurs, which enables to further reduce an issuance interval of column commands.

The interface chip IF further includes a power-down control circuit 34. The power-down control circuit 34 activates a power down signal PWDN0 when the clock enable signal CKE0 is deactivated to a low level. As shown in FIG. 13, the power down signal PWDN0 is supplied to the core chips CC0 to CC7 in common through the TSV buffer 61 and the through silicon via TSV1.

The interface chip IF further includes the mode register 60. Operation modes of the semiconductor device 10 according to the embodiment are set in the mode register 60. The operation modes to be set include also discrimination of the address allocation methods, that is, the LRA mode/the PRA mode, the 1-rank mode/the 2-rank mode, the 1-kbyte mode/the 2-kbyte mode, and the ×8-bit mode/the ×4-bit mode. A mode signal MODE which is an output of the mode register 60 is supplied to various circuit blocks and is also supplied to the core chips CC0 to CC7 through the through silicon via TSV. For example, the input buffer 31 enables the chip selection signal CS1 and the clock enable signal CKE1 when the mode signal MODE indicates the 2-rank mode, and disenables the chip selection signal CS1 and the clock enable signal CKE1 when the mode signal MODE indicates the 1-rank mode.

The outline of the interface chip IF is as explained above. Circuit configurations of the core chips CC0 to CC7 are explained next.

As shown in FIG. 13, a memory cell array 70 included in each of the core chips CC0 to CC7 is divided into eight physical banks Bank0 to Bank7. A bank is a unit capable of individually receiving commands. In other words, each of the banks can operate independently of each other on a non-exclusive basis. A plurality of physical banks belonging to different core chips, respectively, constitute one logical bank when the semiconductor device 10 operates in the LRA mode, and one physical bank constitutes one logical bank when the semiconductor device 10 operates in the PRA mode. A logical bank is a unit handled as one bank by a memory controller that controls the semiconductor device 10.

In the memory cell array 70, a plurality of word lines WL and a plurality of bit lines BL intersect, and a memory cell MC is arranged at each intersection (only one word line WL, one bit line BL, and one memory cell MC are shown in FIG. 13). Selection of a word line WL is performed by a row decoder 71. The bit lines BL are connected to corresponding sense amplifiers in a sense circuit 72. Selection of a sense amplifier is performed by a column decoder 73.

A row address RA is supplied to the row decoder 71 through a row-address control circuit 74. To the row-address control circuit 74, the address signal ADD and the bank address signal BA are supplied through the through silicon via TSV1, and an active signal ACT and a refresh signal REF are also supplied from a row comparison circuit 63.

When the active signal ACT is activated, the row-address control circuit 74 supplies the address signal ADD to the row decoder 71 of one of the banks selected based on the bank address signal BA. This activates a specified word line WL in the specified bank. That is, a row access is performed. On the other hand, when the refresh signal REF is activated, the row address control circuit 74 supplies a count value of a refresh counter (not shown) to the row decoders 71 of all the banks. This activates a specified word line WL in all the banks, thereby performing a refresh operation.

The row comparison circuit 63 also outputs precharge signals PRE and PREA. The precharge signals PRE and PREA are supplied to a precharge control circuit 77. The precharge control circuit 77 precharges one of the banks specified by the bank address signal BA when the precharge signal PRE is activated, and precharges all the banks when the precharge signal PREA is activated.

A column address CA is supplied to the column decoder 73 through a column-address control circuit 75. To the column-address control circuit 75, the address signal ADD and the bank address signal BA are supplied through the through silicon via TSV1, and the read signal READ and the write signal WRITE are also supplied from a column comparison circuit 64.

The column-address control circuit 75 supplies the address signal ADD to the column decoder 73 of a bank selected based on the bank address signal BA when the read signal READ or the write signal WRITE is activated. This connects a specified sense amplifier of the specified bank to a read/write amplifier 78. Therefore, when the read signal READ is activated, read data that is read from the memory cell array 70 through the sense circuit 72 is transferred to the interface chip IF through the read/write amplifier 78 and the through silicon via TSV1. When the write signal WRITE is activated, write data that is transferred from the interface chip IF through the through silicon via TSV1 is written in the memory cell array 70 through the read/write amplifier 78 and the sense circuit 72.

The row comparison circuit 63 compares the chip selection address SID(IF) supplied from the interface chip IF through the through silicon via TSV1 and the specific chip address SID(CORE) allocated to the corresponding one of the core chips CC0 to CC7 with each other, and activates the active signal ACT, the refresh signal REF, the precharge signal PRE, or the precharge signal PREA based on the active signal ACT0, the refresh signal REFT0, and the precharge signal PRE0 when both of the chip addresses coincide. The specific chip address SID(CORE) is held in a chip-address holding circuit 76. The chip-address holding circuits 76 are cascaded between the core chips CC0 to CC7 through the through silicon vias TSV2 of the type shown in FIG. 2B, which enables different chip addresses SID(CORE) to be set in the respective core chips CC0 to CC7. A circuit configuration of the row comparison circuit 63 is explained later.

The column comparison circuit 64 compares the chip selection address SID(IF) supplied from the interface chip IF through the through silicon via TSV1 and the specific chip address SID(CORE) allocated to the corresponding one of the core chips CC0 to CC7 with each other, and activates the read signal READ or the write signal WRITE when both of the chip addresses coincide. Specifically, when the chip selection address SID(IF) and the chip address SID(CORE) coincide, the column comparison circuit 64 causes the read signal READ or the write signal WRITE supplied from the interface chip IF to pass through without processing and supplies the signal to the column-address control circuit 75 and the read/write amplifier 78. A circuit configuration of the column comparison circuit 64 is also explained later.

Each of the core chips CC0 to CC7 also includes a power down circuit 65. The power down circuit 65 causes the corresponding core chip to enter a power down mode based on the chip selection address SID(IF), the chip address SID(CORE), and the power down signal PWDN0. Specifically, when the chip selection address SID(IF) and the chip address SID(CORE) coincide, the power down circuit 65 causes the corresponding core chip to enter the power down mode in response to the power down signal PWDN0.

The circuit configuration of the core chips CC0 to CC7 is as described above. Specific circuit configurations of the chip selection address generating circuit 42, the row comparison circuit 63, and the column comparison circuit 64 are explained next.

Figure 14:
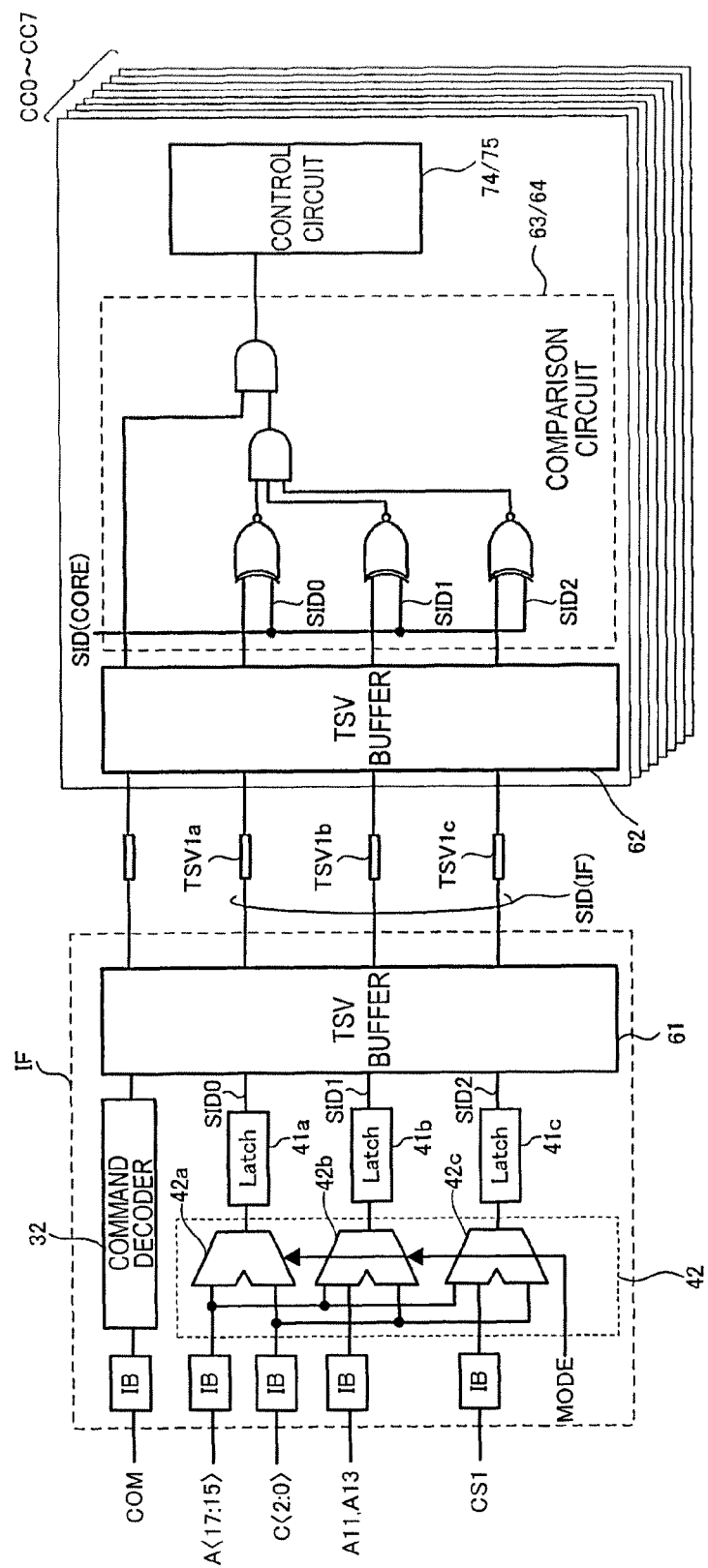
FIG. 14 is a functional block diagram indicative of an embodiment of extracted parts of the semiconductor device 10, related to a chip selection address SID(IF) and a chip address SID(CORE)

Turning to FIG. 14, the chip selection address generating circuit 42 included in the interface chip IF includes multiplexers 42a to 42c that generate the bits SID0 to SID2 of the chip selection address SID(IF), respectively. Selection by the multiplexers 42a to 42c is performed according to the mode signal MODE. The bits SID0 to SID2 output from the multiplexers 42a to 42c are latched by corresponding latch circuits 41a to 41c and then supplied to corresponding through silicon vias TSV1a to TSV1c through the TSV buffer 61, respectively. The bits SID0 to SID2 supplied to the core chips CC0 to CC7 through the through silicon vias TSV1a to TSV1c are supplied to a comparison circuit 63/64 through the TSV buffer 62.

The comparison circuit 63/64 is a circuit schematically showing relevant parts of the row comparison circuit 63 and the column comparison circuit 64 combined. As shown in FIG. 14, the comparison circuit 63/64 compares the chip selection address SID(IF) supplied from the interface chip IF and the chip address SID(CORE) unique to the corresponding one of the core chips CC0 to CC7 with each other, and causes the various internal commands (such as ACT0 and READ) supplied from the interface chip IF to pass through to be supplied to a control circuit 74/75 when both of the addresses coincide. The control circuit 74/75 is a circuit block collectively showing the row-address control circuit 74 and the column-address control circuit 75.

As described above, in the semiconductor device 10 according to the present embodiment, the chip selection address SID(IF) supplied from the interface chip IF to the core chips CC0 to CC7 is three bits and is transferred through the three through silicon vias TSV1a to TSV1c.

Figures 15A, 15B, 15C:
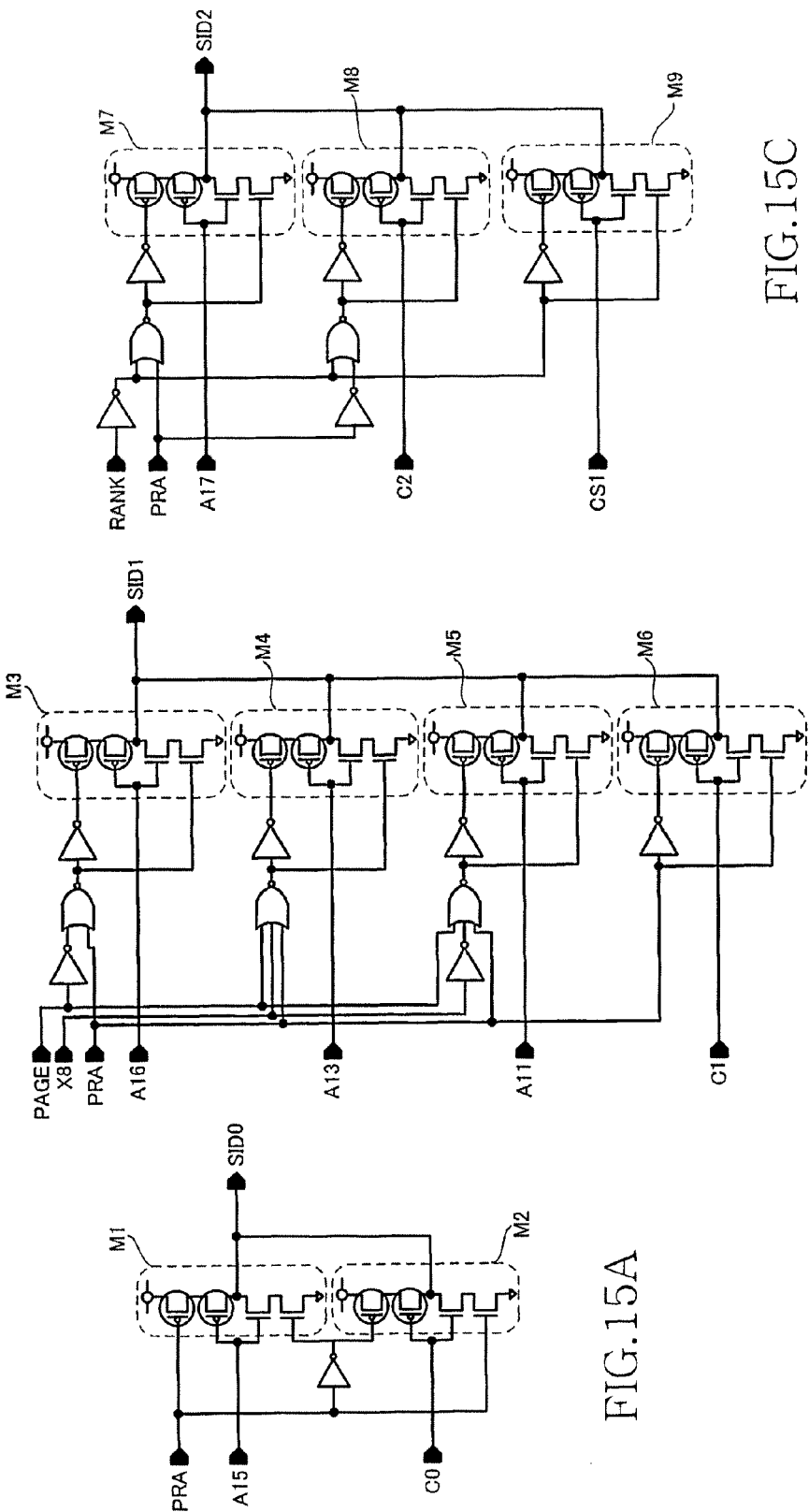

Turning to FIG. 15A, the multiplexer 42a that generates the bit SID0 includes two tristate inverters M1 and M2. A PRA signal, which is a part of the mode signal MODE, is supplied to the tristate inverters M1 and M2 as a selection signal. The PRA signal becomes a low level when the semiconductor device 10 operates in the LRA mode and becomes a high level when the semiconductor device 10 operates in the PRA mode. With the circuit configuration shown in FIG. 15A, the tristate inverter M1 is activated and the tristate inverter M2 is deactivated when the PRA signal is a low level, and the tristate inverter M1 is deactivated and the tristate inverter M2 is activated when the PRA signal is a high level.

A bit A15 (X15) of the address signal is input to an input node of the tristate inverter M1, and the bit C0 of the chip selection signal is input to an input node of the tristate inverter M2. Output nodes of the tristate inverters M1 and M2 are short-circuited, and an output thereof is used as the bit SID0 of the chip selection address SID(IF).

With this configuration, the bit A15 (X15) of the address signal is used as the bit SID0 when the semiconductor device 10 operates in the LRA mode, and the bit C0 of the chip selection address is used as the bit SID0 when the semiconductor device 10 operates in the PRA mode. That is, a selection operation shown in a row of SID0 in FIG. 7 is realized.

Turning to FIG. 15B, the multiplexer 42b that generates the bit SID1 includes four tristate inverters M3 to M6. Signals generated from the PRA signal, a PAGE signal, and an X8 signal, which are parts of the mode signal MODE, are supplied to the tristate inverters M3 to M6, respectively, as a selection signal. The PAGE signal becomes a high level when the semiconductor device 10 operates in the 1-kbyte mode and becomes a low level when the semiconductor device 10 operates in the 2-kbyte mode. With the circuit configuration shown in FIG. 15B, the tristate inverter M3 is activated when the PRA signal is a low level and the PAGE signal is a high level, the tristate inverter M4 is activated when the PRA signal, the PAGE signal, and the X8 signal are all in a low level, the tristate inverter M5 is activated when the PRA signal and the PAGE signal are a low level and the X8 signal is a high level, and the tristate inverter M6 is activated when the PRA signal is a high level.

A bit A16 (X16) of the address signal is input to an input node of the tristate inverter M3, a bit A13 (Y13) of the address signal is input to an input node of the tristate inverter M4, a bit A11 (Y11) of the address signal is input to an input node of the tristate inverter M5, and the bit C1 of the chip selection signal is input to an input node of the tristate inverter M6. Output nodes of the tristate inverters M3 to M6 are short-circuited, and an output thereof is used as the bit SID1 of the chip selection address SID(IF).

With this configuration, the bit A16 (X16) of the address signal is used as the bit SID1 when the semiconductor device 10 operates in the LRA mode and the 1-kbyte mode, the bit A13 (Y13) of the address signal is used as the bit SID1 when the semiconductor device 10 operates in the LRA mode, the 2-kbyte mode, and the x4-bit mode, the bit A11 (Y11) of the address signal is used as the bit SID1 when the semiconductor device 10 operates in the LRA mode, the 2-kbyte mode, and the x8-bit mode, and the bit C1 of the chip selection signal is used as the bit SID1 when the semiconductor device 10 operates in the PRA mode. That is, a selection operation shown in a row of SID1 in FIG. 7 is realized.

Turning to FIG. 15C, the multiplexer 42c that generates the bit SID2 includes three tristate inverters M7 to M9. Signals generated from the PRA signal and a RANK signal, which are parts of the mode signal MODE, are supplied to the tristate inverters M7 to M9, respectively, as a selection signal. The RANK signal becomes a high level when the semiconductor device 10 operates in the 1-rank mode and becomes a low level when the semiconductor device 10 operates in the 2-rank mode. With the circuit configuration shown in FIG. 15C, the tristate inverter M7 is activated when the PRA signal is a low level and the RANK signal is a high level, the tristate inverter M8 is activated when both of the PRA signal and the RANK signal are a high level, and the tristate inverter M9 is activated when the RANK signal is a low level.

A bit A17 (X17) of the address signal is input to an input node of the tristate inverter M7, the bit C2 of the chip selection signal is input to an input node of the tristate inverter M8, and the chip selection signal CS1 is input to an input node of the tristate inverter M9. Output nodes of the tristate inverters M7 to M9 are short-circuited and an output thereof is used as the bit SID2 of the chip selection address SID(IF).

With this configuration, the bit A17 (X17) of the address signal is used as the bit SID2 when the semiconductor device 10 operates in the LRA mode and the 1-rank mode, the bit C2 of the chip selection signal is used as the bit SID2 when the semiconductor device 10 operates in the PRA mode and the 2-rank mode, and the chip selection signal CS1 is used as the SID2 when the semiconductor device 10 operates in the 2-rank mode. That is, a selection operation shown in a row of SID2 in FIG. 7 is realized.

As described above, in the semiconductor device 10 of the present embodiment, generation of the chip selection address SID(IF) according to the operation mode is performed on the side of the interface chip IF, which enables the number of bits of the chip selection address SID(IF) supplied from the interface chip IF to the core chips CC0 to CC7 to be fixed to three regardless of which operation mode is selected. Accordingly, the number of through silicon vias TSV required for transfer of the chip selection address SID(IF) can be reduced to three.

Figure 16:
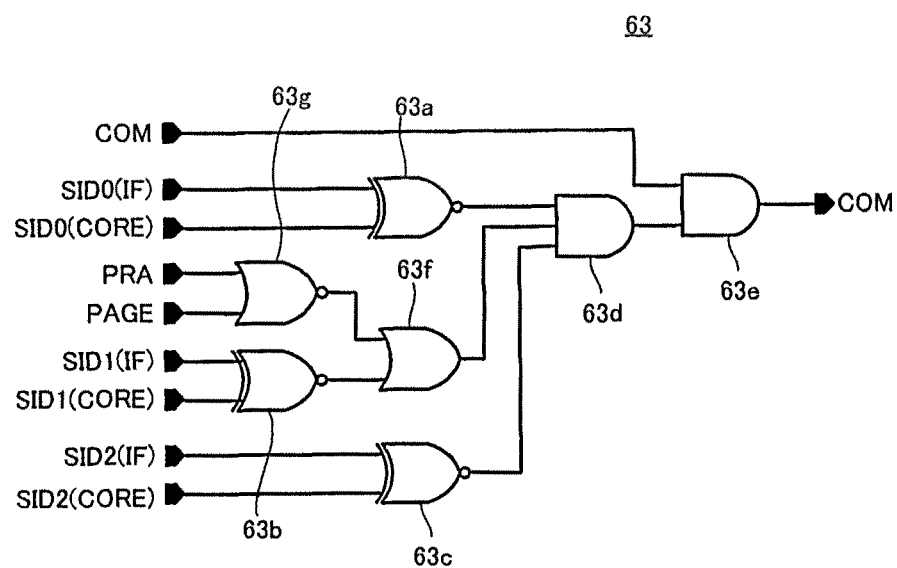
FIG. 16 is a circuit diagram indicative of an embodiment of the row comparison circuit 63.

Turning to FIG. 16, the row comparison circuit 63 includes ENOR circuits 63a to 63c that compare the bits SID0(IF) to SID2(IF) of the chip selection address SID(IF) with the bits SID0(CORE) to SID2(CORE) of the chip address SID(CORE) unique to the corresponding core chip, respectively. Therefore, when all pairs of the bits coincide, outputs of the ENOR circuits 63a to 63c all become a high level, which activates an output of an AND circuit 63d to a high level. When the output of the AND circuit 63d is activated to a high level, the various commands (such as ACT0 and PRE0) are passed through an AND circuit 63e and are supplied to the row-address control circuit 74 shown in FIG. 13.

However, because the output of the ENOR circuit 63b is supplied to the AND circuit 63d through an OR circuit 63f, an output of the OR circuit 63f is fixed to a high level regardless of an output level of the ENOR circuit 63b when the other input of the OR circuit 63f becomes a high level. The other input of the OR circuit 63f is generated by a NOR circuit 63g that receives the PRA signal and the PAGE signal and thus the output of the OR circuit 63f is fixed to a high level when the semiconductor device 10 is in the PRA mode and the 2-kbyte mode. This is because, when the semiconductor device 10 is in the PRA mode and the 2-kbyte mode, one bit (Y11 or Y13) of the column address is used as the bit SID2 of the chip selection address SID(IF) and is not determined at the time of a row access, as shown in FIG. 7.

Figure 17:
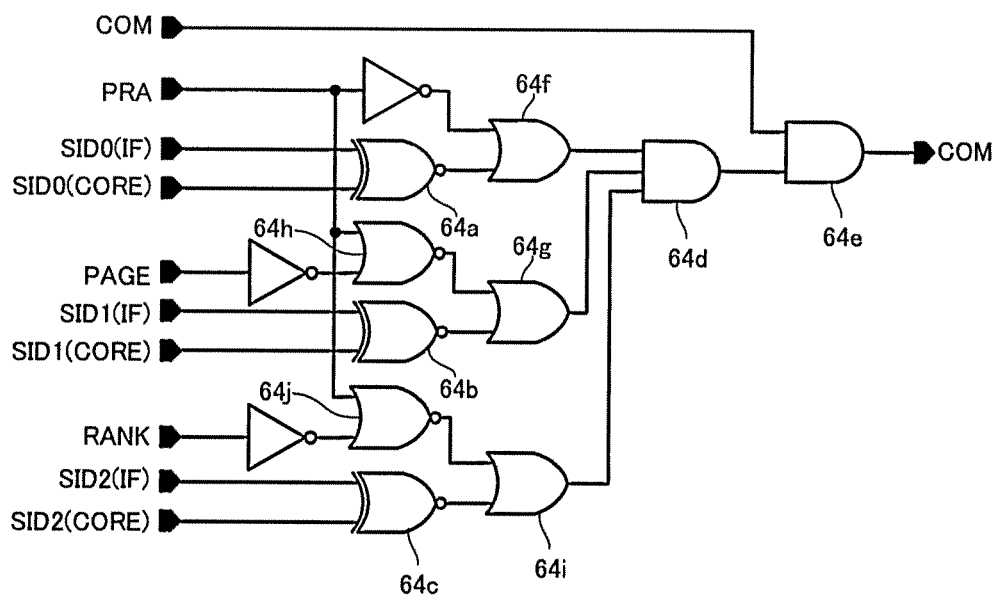
FIG. 17 is a circuit diagram indicative of an embodiment of the column comparison circuit 64.

Turning to FIG. 17, the column comparison circuit 64 includes ENOR circuits 64a to 64c that compare the bits SID0(IF) to SID2(IF) of the chip selection address SID(IF) with the bits SID0(CORE) to SID2(CORE) of the chip address SID(CORE) unique to the corresponding core chip, respectively. Therefore, when all pairs of the bits coincide, outputs of the ENOR circuits 64a to 64c all become a high level, which activates an output of an AND circuit 64d to a high level. When the output of the AND circuit 64d is activated to a high level, the various commands (such as READ and WRITE) are passed through an AND circuit 64e and are supplied to the column-address control circuit 75 shown in FIG. 13.

However, because the output of the ENOR circuit 64a is supplied to the AND circuit 64d through an OR circuit 64f, an output of the OR circuit 64f is fixed to a high level regardless of an output level of the ENOR circuit 64a when the other input of the OR circuit 64f becomes a high level. The other input of the OR circuit 64f is an inversion signal of the PRA signal. This means that the output of the OR circuit 64f is fixed to a high level when the semiconductor device 10 operates in the LRA mode. This is because the bit SID0 of the chip selection address SID(IF) is already determined at the time of a row access when the semiconductor device 10 is in the LRA mode, as shown in FIG. 7.

Furthermore, because the output of the ENOR circuit 64b is supplied to the AND circuit 64d through an OR circuit 64g, an output of the OR circuit 64g is fixed to a high level regardless of an output level of the ENOR circuit 64b when the other input of the OR circuit 64g becomes a high level. Because the other input of the OR circuit 64g is generated by a NOR circuit 64h that receives the PRA signal and an inverted PAGE signal, the output of the OR circuit 64g is fixed to a high level when the semiconductor device 10 operates in the LRA mode and the 1-kbyte mode. This is because the bit SID1 of the chip selection address SID(IF) is already determined at the time of a row access when the semiconductor device 10 operates in the LRA mode and the 1-kbyte mode, as shown in FIG. 7.

Because the output of the ENOR circuit 64c is supplied to the AND circuit 64d through an OR circuit 64i, an output of the OR circuit 64i is fixed to a high level regardless of an output level of the ENOR circuit 64c when the other input of the OR circuit 64i becomes a high level. The other input of the OR circuit 64i is generated by a NOR circuit 64j that receives the PRA signal and an inverted RANK signal and thus the output of the OR circuit 64i is fixed to a high level when the semiconductor device 10 operates in the LRA mode and the 1-rank mode. This is because the bit SID2 of the chip selection address SID(IF) is already determined at the time of a row access when the semiconductor device 10 is in the LRA mode and the 1-rank mode, as shown in FIG. 7.

As described above, in the semiconductor device 10 according to the present embodiment, the chip selection address SID(IF) supplied from the interface chip IF to the core chips CC0 to CC7 is fixed to three bits and accordingly the circuit configurations of the row comparison circuit 63 and the column comparison circuit 61 can be simplified. This configuration can decrease the chip size of the core chips CC0 to CC7 and realize cost reduction.

It is apparent that the present invention is not limited to the above embodiments, but may be modified and changed without departing from the scope and spirit of the invention.

For example, while the example in which the present invention is applied to the semiconductor device 10 including the interface chip IF and the core chips CC0 to CC7 has been explained in the above embodiment, the present invention can be applied to any types of semiconductor devices as long as the semiconductor devices are of a stacked type including a control chip and a plurality of controlled chips. As an example, the present invention can be also applied to a semiconductor device in which a control chip and controlled chips have the same circuit configuration and one of the chips is used as the control chip while the remaining chips are used as the controlled chips.

What is claimed is:

1. A device comprising:
   a first semiconductor chip including a plurality of first terminals, a plurality of second terminals, and a first circuit coupled between the first and second terminals and configured to control combinations of the first terminals to be electrically connected to the second terminals; and
   a second semiconductor chip including a plurality of third terminals coupled respectively to the second terminals, an internal circuit, and a second circuit coupled between the third terminals and the internal circuit and configured to activate the internal circuit when a combination of signals appearing at the third terminals indicates a chip selection,
   wherein the third terminals are smaller in number than the first terminals,
   wherein the first semiconductor chip further includes a mode register temporarily storing mode information, and the first circuit is configured to electrically connect selected ones of the first terminals respectively to the second terminals in response to a content of the mode information, and
   wherein the mode information takes a selected one of first and second modes, and the first circuit is configured to electrically connect first selected ones of the first terminals respectively to the second terminals in response to the mode information taking the first mode and second selected ones of the first terminals respectively to the second terminals in response to the mode information taking the second mode, the first selected ones being different from the second selected ones.

2. The device as claimed in claim 1, wherein the internal circuit of the second semiconductor chip comprises a memory circuit, and the first terminal includes a plurality of address terminals supplied with address signals for designating an address of the memory circuit from and into which data are to be read and written.

3. The device as claimed in claim 2, wherein the second semiconductor chip includes a plurality of penetration electrodes each penetrating the second semiconductor chip, the second semiconductor chip being stacked over the first semiconductor chip, and the second terminals being connected to the third terminals through the penetration electrodes, respectively.

4. A device comprising:
   a first semiconductor chip including a plurality of first terminals, a plurality of second terminals, and a first circuit coupled between the first and second terminals and configured to control combinations of the first terminals to be electrically connected to the second terminals; and
   a second semiconductor chip including a plurality of third terminals coupled respectively to the second terminals, an internal circuit, and a second circuit coupled between the third terminals and the internal circuit and configured to activate the internal circuit when a combination of signals appearing at the third terminals indicates a chip selection,
   wherein the second circuit comprises a chip address storage circuit and a comparison circuit, the chip address storage circuit storing a chip address, the comparison circuit being coupled to the third terminals and the chip address storage circuit and configured to compare the chip address stored in the chip address storage circuit with the signals appearing at the third terminals and produce an access allowance signal when the chip selection is indicated.

5. The device as claimed in claim 4, wherein the internal circuit comprises an access circuit and a data storage circuit coupled to the access circuit, the access circuit being configured to perform data read and write operations on the data storage circuit in response to the access allowance signal.

6. The device as claimed in claim 4, further comprising a third semiconductor chip, the third semiconductor chip including a plurality of fourth terminals coupled respectively to the second terminals, an additional internal circuit, and a third circuit coupled between the fourth terminals and the additional internal circuit and configured to activate the additional internal circuit when a combination of signals appearing at the fourth terminals indicates a chip selection.

7. The device as claimed in claim 6, wherein the first, second and third semiconductor chips are stacked with one another so that the second semiconductor chip is between the first and third semiconductor chips.

8. The device as claimed in claim 7, wherein the second semiconductor chip includes a plurality of penetration electrodes each penetrating the second semiconductor chip, each of the penetration electrodes electrically connects an associated one of the second terminals of the first semiconductor chips, an associated one of the third terminals of the second semiconductor chips and an associated one of the fourth terminals of the third semiconductor chip to one another.

9. A device comprising:
a first semiconductor chip including a plurality of first terminals, a plurality of second terminals, and a first circuit coupled between the first and second terminals and configured to control combinations of the first terminals to be electrically connected to the second terminals;
a second semiconductor chip including a plurality of third terminals coupled respectively to the second terminals, a first internal circuit, and a second circuit coupled between the third terminals and the first internal circuit and configured to activate the first internal circuit when signals appearing at the third terminals indicate a selection of the second semiconductor chip; and
a third semiconductor chip including a plurality of fourth terminals coupled respectively to the second terminals, a second internal circuit, and a third circuit coupled between the fourth terminals and the second internal circuit and configured to activate the second internal circuit when signals appearing at the fourth terminals indicate a selection of the third semiconductor chip,
wherein the first semiconductor chip further includes a mode register temporarily storing mode information that takes a selected one of first and second modes, and
wherein the first circuit is configured to electrically connect first selected ones of the first terminals respectively to the second terminals in response to the mode information taking the first mode and second selected ones of the first terminals respectively to the second terminals in response to the mode information taking the second mode, the first selected ones being different from the second selected ones.

10. The device as claimed in claim 9, wherein the first, second and third semiconductor chips are stacked with one another so that the second semiconductor chip is between the first and third semiconductor chips.

11. The device as claimed in claim 10, wherein the second semiconductor chip includes a plurality of penetration electrodes each penetrating the second semiconductor chip, each of the penetration electrodes electrically connects an associated one of the second terminals of the first semiconductor chips, an associated one of the third terminals of the second semiconductor chip and an associated one of the fourth terminals of the third semiconductor chip to one another.

12. The device as claimed in claim 9,
wherein the first internal circuit of the second semiconductor chip includes a first memory cell array and a first access circuit coupled to the first memory cell array, the first access circuit performing, when activated, data read and write operations on the first memory cell array to transfer data between the first and second semiconductor chips; and
wherein the second internal circuit of the third semiconductor chip includes a second memory cell array and a second access circuit coupled to the second memory cell array, the second access circuit performing, when activated, data read and write operations on the second memory cell array to transfer data between the first and third semiconductor chips.

13. The device as claimed in claim 12, wherein the first, second and third semiconductor chips are stacked with one another so that second semiconductor chip is between the first and third semiconductor chips.

14. The device as claimed in claim 13, wherein the second semiconductor chip includes a plurality of first penetration electrodes each penetrating the second semiconductor chip and a plurality of second penetration electrodes each penetrating the second semiconductor chip, each of the first penetration electrodes electrically connects an associated one of the second terminals of the first semiconductor chips, an associated one of the third terminals of the second semiconductor chip and an associated one of the fourth terminals of the third semiconductor chip to one another, and the second penetration electrodes electrically connect the first access circuit of the second semiconductor chip and the second access circuit of the third semiconductor chip to the first semiconductor chip.

* * * * *